(12) United States Patent
Salowe

(10) Patent No.: US 9,165,103 B1
(45) Date of Patent: Oct. 20, 2015

(54) METHODS, SYSTEMS, AND ARTICLES OF MANUFACTURE FOR TESSELLATING AND LABELING ROUTING SPACE FOR ROUTING ELECTRONIC DESIGNS

(71) Applicant: Cadence Design Systems, Inc., San Jose, CA (US)

(72) Inventor: Jeffrey S. Salowe, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/318,507

(22) Filed: Jun. 27, 2014

(51) Int. Cl.
G06F 17/50 (2006.01)

(52) U.S. Cl.
CPC .................................. *G06F 17/5077* (2013.01)

(58) Field of Classification Search
CPC .. G06F 17/5077; G06F 17/50; G06F 17/5081
See application file for complete search history.

(56) References Cited

U.S. PATENT DOCUMENTS

| | | | |
|---|---|---|---|
| 2,915,831 A | 12/1959 | Parker | |
| 4,484,292 A | 11/1984 | Hong et al. | |
| 4,811,237 A | 3/1989 | Putatunda et al. | |
| 5,535,134 A | 7/1996 | Cohn et al. | |
| 5,644,500 A | 7/1997 | Miura et al. | |
| 5,729,469 A | 3/1998 | Kawakami | |
| 5,770,481 A | 6/1998 | Fujii | |
| 5,781,446 A | 7/1998 | Wu | |
| 5,801,959 A | 9/1998 | Ding et al. | |
| 6,011,912 A | 1/2000 | Yui et al. | |
| 6,298,468 B1 | 10/2001 | Zhen | |
| 6,324,675 B1 | 11/2001 | Dutta et al. | |
| 6,349,403 B1 | 2/2002 | Dutta et al. | |
| 6,370,673 B1 | 4/2002 | Hill | |
| 6,407,434 B1 | 6/2002 | Rostoker et al. | |
| 6,490,713 B2 | 12/2002 | Matsumoto | |
| 6,505,333 B1 | 1/2003 | Tanaka | |
| 6,543,041 B1 | 4/2003 | Scheffer et al. | |
| 6,557,145 B2 | 4/2003 | Boyle et al. | |
| 6,557,153 B1 | 4/2003 | Dahl et al. | |

(Continued)

OTHER PUBLICATIONS

Li et al., "NEMO: A New Implicit-Connection Graph-Based Gridless Router With Multilayer Planes and Pseudo Tile Propagation," "IEEE Trans. on CAD of ICs & Systems, vol. 26, No. 4 Apr. 2007, pp. 705-718.".

(Continued)

*Primary Examiner* — Nha Nguyen
(74) *Attorney, Agent, or Firm* — Vista IP Law Group, LLP

(57) ABSTRACT

Various aspects described herein create tessellated regions by identifying tessellation lines in one or more directions based at least on fixed shape(s) or route(s). New cells or shapes are added to the design by aligning at least some of the boundary segments of the new cells or shapes with existing tessellation lines. Tessellation lines are dynamically adjustable. At least some tessellated regions are associated with initial or tentative track pattern labels some of which are iteratively updated during implementation of the design. Multiple candidate track patterns may be ranked based on consistency costs to determine a tentative track pattern. Designs may be implemented with a trackless approach in trackless region(s) followed by a tracked approach based at least in part upon the initial or tentative labels that are dynamically adjusted during implementation. Capacities and demands are assessed at boundary segments of cells by using the tracked or trackless approach.

20 Claims, 19 Drawing Sheets

(56) References Cited

U.S. PATENT DOCUMENTS

| | | |
|---|---|---|
| 6,609,237 B1 | 8/2003 | Hamawaki et al. |
| 6,763,512 B2 | 7/2004 | Xing |
| 6,769,105 B1 | 7/2004 | Teig et al. |
| 6,813,755 B2 | 11/2004 | Xing |
| 6,851,100 B1 | 2/2005 | You et al. |
| 6,892,371 B1 | 5/2005 | Teig et al. |
| 6,938,226 B2 | 8/2005 | Nguyen et al. |
| 6,938,234 B1 | 8/2005 | Teig et al. |
| 6,957,407 B2 | 10/2005 | Suto |
| 6,957,411 B1 | 10/2005 | Teig et al. |
| 6,981,235 B1 | 12/2005 | Salowe et al. |
| 6,996,512 B2 | 2/2006 | Alpert et al. |
| 7,016,794 B2 | 3/2006 | Schultz |
| 7,039,881 B2 | 5/2006 | Regan |
| 7,051,313 B1 | 5/2006 | Betz et al. |
| 7,076,750 B1 | 7/2006 | Lukanc |
| 7,089,526 B1 | 8/2006 | Salowe et al. |
| 7,096,445 B1 | 8/2006 | Pucci et al. |
| 7,100,128 B1 | 8/2006 | Nequist et al. |
| 7,107,564 B1 | 9/2006 | Teig et al. |
| 7,117,468 B1 | 10/2006 | Teig et al. |
| 7,139,993 B2 | 11/2006 | Proebsting et al. |
| 7,222,322 B1 | 5/2007 | Chyan et al. |
| 7,257,797 B1 | 8/2007 | Waller et al. |
| 7,363,607 B2 | 4/2008 | Birch et al. |
| 7,516,433 B1 | 4/2009 | Pucci et al. |
| 7,523,430 B1 | 4/2009 | Patel |
| 7,594,214 B1 | 9/2009 | Salowe et al. |
| 7,640,520 B2 | 12/2009 | Wang et al. |
| 7,657,852 B2 | 2/2010 | Waller |
| 7,694,261 B1 | 4/2010 | Chyan et al. |
| 7,735,043 B2 | 6/2010 | Ueda |
| 7,752,590 B1 | 7/2010 | Chyan et al. |
| 7,802,208 B1 | 9/2010 | Waller et al. |
| 7,890,909 B2 | 2/2011 | Pyapali et al. |
| 7,934,177 B2 | 4/2011 | Shin |
| 7,958,480 B1 | 6/2011 | Slonim et al. |
| 8,006,216 B1 | 8/2011 | Chen et al. |
| 8,028,253 B2 | 9/2011 | Drapeau |
| 8,032,856 B2 | 10/2011 | Itagaki |
| 8,108,823 B1 | 1/2012 | Allen et al. |
| 8,239,806 B2 | 8/2012 | Chen et al. |
| 8,286,111 B2 | 10/2012 | Chandra et al. |
| 8,375,348 B1* | 2/2013 | Raj et al. ............... 716/126 |
| 8,418,110 B2 | 4/2013 | Keinert et al. |
| 8,473,885 B2 | 6/2013 | Cohn et al. |
| 8,490,036 B2 | 7/2013 | Waller |
| 8,495,547 B2 | 7/2013 | Keinert et al. |
| 8,495,549 B2 | 7/2013 | Maruyama et al. |
| 8,510,703 B1 | 8/2013 | Wadland et al. |
| 8,560,998 B1 | 10/2013 | Salowe et al. |
| 8,612,914 B2 | 12/2013 | Sherlekar et al. |
| 8,640,080 B1 | 1/2014 | Salowe et al. |
| 8,645,893 B1 | 2/2014 | Yeung et al. |
| 8,671,368 B1 | 3/2014 | Salowe et al. |
| 8,683,418 B2 | 3/2014 | Bose et al. |
| 8,689,121 B2 | 4/2014 | O'Riordan |
| 8,769,455 B1 | 7/2014 | Singh et al. |
| 8,782,586 B2 | 7/2014 | Sezginer et al. |
| 8,914,763 B1 | 12/2014 | Raj et al. |
| 2001/0038612 A1 | 11/2001 | Vaughn |
| 2003/0014201 A1 | 1/2003 | Schultz |
| 2003/0084418 A1 | 5/2003 | Regan |
| 2003/0126578 A1 | 7/2003 | Wadland et al. |
| 2004/0143797 A1 | 7/2004 | Nguyen et al. |
| 2006/0288323 A1 | 12/2006 | Birch |
| 2007/0044060 A1 | 2/2007 | Waller |
| 2007/0101303 A1 | 5/2007 | Lien |
| 2007/0106969 A1 | 5/2007 | Birch et al. |
| 2007/0162884 A1 | 7/2007 | Matsuno et al. |
| 2007/0245286 A1 | 10/2007 | Ueda |
| 2008/0072182 A1 | 3/2008 | He et al. |
| 2008/0244504 A1 | 10/2008 | Drapeau |
| 2009/0055792 A1 | 2/2009 | Itagaki |
| 2009/0144688 A1 | 6/2009 | Uchino et al. |
| 2009/0172628 A1 | 7/2009 | Chyan |
| 2010/0011327 A1 | 1/2010 | Becker et al. |
| 2010/0037200 A1 | 2/2010 | Ghan |
| 2010/0100862 A1* | 4/2010 | Ohtsuka ............... 716/13 |
| 2010/0106274 A1 | 4/2010 | Konno et al. |
| 2010/0115479 A1 | 5/2010 | Hatano et al. |
| 2010/0122227 A1 | 5/2010 | Waller |
| 2010/0122228 A1 | 5/2010 | McCracken et al. |
| 2010/0199253 A1 | 8/2010 | Cheng et al. |
| 2010/0205575 A1 | 8/2010 | Arora et al. |
| 2010/0229140 A1 | 9/2010 | Strolenberg et al. |
| 2010/0306727 A1 | 12/2010 | Itagaki |
| 2011/0014786 A1 | 1/2011 | Sezginer |
| 2011/0055784 A1 | 3/2011 | Gao et al. |
| 2011/0119648 A1 | 5/2011 | Chen et al. |
| 2011/0185329 A1 | 7/2011 | Wen et al. |
| 2011/0214100 A1 | 9/2011 | McElvain |
| 2011/0219341 A1 | 9/2011 | Cao et al. |
| 2011/0260318 A1 | 10/2011 | Eisenstadt |
| 2011/0296360 A1 | 12/2011 | Wang et al. |
| 2012/0079442 A1 | 3/2012 | Akar et al. |
| 2012/0131528 A1 | 5/2012 | Chen et al. |
| 2012/0241986 A1 | 9/2012 | Sherlekar et al. |
| 2012/0286331 A1 | 11/2012 | Aton et al. |
| 2013/0019220 A1 | 1/2013 | Maruyama et al. |
| 2013/0036396 A1 | 2/2013 | Arayama et al. |
| 2013/0086543 A1 | 4/2013 | Agarwal et al. |
| 2013/0086545 A1 | 4/2013 | Alpert et al. |
| 2013/0155555 A1 | 6/2013 | Blanc et al. |
| 2013/0159965 A1 | 6/2013 | Karatal et al. |
| 2014/0157220 A1 | 6/2014 | Arayama et al. |
| 2014/0167117 A1 | 6/2014 | Quandt et al. |

OTHER PUBLICATIONS

Lin et al., "Double Patterning Lithography Aware Grid less Detailed Routing with Innovative Conflict Graph,"'DAC'1 0, Jun. 13-18, 2010, pp. 398-403."

Agilent Technologies, "Momentum", 2006, Agilient, pp. 1-40.

Cho et al., "Double Patterning Technology Friendly Detailed Routing", IEEE/ACM International Conference, 2008, pp. 506-511.

Dion et al., Contour: A Tile-based Gridless Router, 30 pages, Western Research Laboratory, Mar. 1995.

Non-Final Office Action dated Dec. 6, 2013 for U.S. Appl. No. 13/931,689.

Notice of Allowance dated Jun. 4, 2014 for U.S. Appl. No. 13/931,689.

Final Office Action dated Nov. 17, 2014 for U.S. Appl. No. 13/931,627.

Non-Final Office Action dated Jun. 13, 2014 for U.S. Appl. No. 13/931,627.

Final Office Action dated Jul. 17, 2014 for U.S. Appl. No. 13/931,503.

Non-Final Office Action dated Apr. 2, 2014 for U.S. Appl. No. 13/931,503.

Notice of Allowance dated Nov. 10, 2014 for U.S. Appl. No. 13/931,503.

Final Office Action dated May 1, 2014 for U.S. Appl. No. 13/931,707.

Non-Final Office Action dated Oct. 28, 2013 for U.S. Appl. No. 13/931,707.

Notice of Allowance dated Sep. 25, 2014 for U.S. Appl. No. 13/931,707.

Non-Final Office Action dated Aug. 4, 2014 for U.S. Appl. No. 13/931,568.

Final Office Action dated Nov. 13, 2014 for U.S. Appl. No. 14/044,836.

Non-Final Office Action dated Jul. 15, 2014 for U.S. Appl. No. 14/044,836.

Hsu et al., "Template-Mask Design Methodology for Double Patterning Technology," 2010 IEEE, pp. 107-111.

Hwang, Chanseok, and Massoud Pedram. "Interconnect design methods for memory design." Proceedings of the 2004 Asia and South Pacific Design Automation Conference. IEEE Press, 2004.

(56) References Cited

OTHER PUBLICATIONS

Jeffrey Salowe, "Gridding for Advanced Process Nodes" 2012.

Jones, David L., "PCB Design Tutorial, Revision A", Jun. 29th 2004, David L. Jones and www.alternatezone.com, pp. 1-25.

Lin, I-Jye, Tsui-Yee Ling, and Yao-Wen Chang. "Statistical circuit optimization considering device and interconnect process variations." Proceedings of the 2007 international workshop on System level interconnect prediction. ACM, 2007.

Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.

Pompl, T., et al. "Practical aspects of reliability analysis for IC designs." Proceedings of the 43rd annual Design Automation Conference. ACM, 2006.

Singh, Jaskirat, and Sachin S. Sapatnekar. "Topology optimization of structured power/ground networks." Proceedings of the 2004 international symposium on Physical design. ACM, 2004.

Wang, Laung-Terng, Charles E. Stroud, and Nur A. Touba. System-on-chip test architectures: nanometer design for testability. Morgan Kaufmann, 2010.

U.S. Appl. No. 13/602,069, filed Aug. 31, 2012.

U.S. Appl. No. 13/602,071, filed Aug. 31, 2012.

U.S. Appl. No. 13/705,164, filed Dec. 4, 2012.

Non-Final Office Action dated Mar. 10, 2015 for U.S. Appl. No. 14/318,507.

Notice of Allowance dated Apr. 8, 2015 for U.S. Appl. No. 13/931,568.

Non-Final Office Action dated Apr. 10, 2015 for U.S. Appl. No. 13/931,689.

Notice of Allowance dated Aug. 10, 2015 for U.S. Appl. No. 14/318,507.

\* cited by examiner

METHODS, SYSTEMS, AND ARTICLES OF MANUFACTURE FOR TESSELLATING AND LABELING ROUTING SPACE FOR ROUTING ELECTRONIC DESIGNS

CROSS-REFERENCE TO RELATED APPLICATION(S)

This application is related to U.S. patent application Ser. No. 13/931,707 filed on Jun. 28, 2013 and entitled "METHODS, SYSTEMS, AND ARTICLES OF MANUFACTURE FOR AUTOMATICALLY ASSIGNING TRACK PATTERNS TO REGIONS FOR PHYSICAL IMPLEMENTATION OF AN ELECTRONIC DESIGN", U.S. patent application Ser. No. 13/931,568 filed on Jun. 28, 2013 and entitled "METHODS, SYSTEMS, AND ARTICLES OF MANUFACTURE FOR INTERACTIVELY IMPLEMENTING PHYSICAL ELECTRONIC DESIGNS WITH TRACK PATTERNS", U.S. patent application Ser. No. 13/931,627 filed on Jun. 28, 2013 and entitled "METHODS, SYSTEMS, AND ARTICLES OF MANUFACTURE FOR ASSIGNING TRACK PATTERNS TO REGIONS OF AN ELECTRONIC DESIGN", U.S. patent application Ser. No. 13/931,689 filed on Jun. 28, 2013 and entitled "METHODS, SYSTEMS, AND ARTICLES OF MANUFACTURE FOR ASSOCIATING TRACK PATTERNS WITH ROUTING FOR ELECTRONIC DESIGNS", and U.S. patent application Ser. No. 13/931,503 filed on Jun. 28, 2013 and entitled "METHODS, SYSTEMS, AND ARTICLES OF MANUFACTURE FOR IMPLEMENTING A PHYSICAL ELECTRONIC DESIGN WITH AREA-BOUNDED TRACKS", the content of all the aforementioned U.S. patent applications is hereby expressly incorporated by reference in its entirety for all purposes.

COPYRIGHT NOTICE

A portion of the disclosure of this patent document includes material, which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

Traditionally, layout track patterns include parallel tracks with uniform pitches, and these tracks cover the entire layout space. This conventional approach does not satisfy the needs for electronic layouts with a typical half-pitch of 14 nm or below. With the half-pitch advancing to 14 nm or below, the track patterns for a certain metal layer may be required or desired to be region based where one track pattern may be associated with or assigned to a region on one layer, while another track pattern may be associated with or assigned to another region on the same layer. Some designs may even demand or desire non-uniform track patterns. Conventional approaches also do not allow periodic changes of track pitches and definitions of regions where one or more track pattern are active. These track pattern requirements pose a challenge for physical design implementation, especially for interactive layout editing. In addition, users may need to be able to interactively define the track patterns during the chip floorplanning or placement stage and follow these track patterns during subsequent physical design stages such as routing, post-layout optimization, engineering change order (ECO), or even specific physical design tasks such as wire editing.

In addition, advanced manufacturing groups have new requirements on where wires or interconnects may be routed. In particular, some routing tracks are intended for double-width wires, some are intended for single-width wires, and so on. Routing tracks, as they were originally devised, applied to every net or connection in the design. To address this, the user must explicitly add the constraints of the track patterns to the routing rules, which is impractical and prone to errors. Moreover, there has been no way to address trackPattern constraints on automatically-generated rules. Some advanced technologies have complex grid requirements. One such requirement is to restrict routing grids in a particular area. Another approach is to give several possible sets of grids, and then to assign one to a given area. The current track pattern representation applies to an entire layer. There is no representation that limits the bounds of a track pattern. Nor is there a representation that maps track patterns to a particular area.

Certain advanced foundries require a layer of an electronic design be tessellated into multiple tessellated regions, and each tessellated region be labeled or marked with a label of a track pattern. Nonetheless, current electronic design automation tools are not capable of determining or identifying such labels, at least not capable of doing so prior to the detail routing stage where the electronic design automation tools implement the detail routes with the geometric information for manufacturing the electronic designs.

Thus, there exists a need for methods, systems, and articles of manufacture for tessellating and labeling routing space for routing electronic designs.

SUMMARY

Disclosed are method(s), system(s), and article(s) of manufacture for tessellating and labeling routing space for routing electronic designs.

Some embodiments are directed at a method for tessellating and labeling routing space for routing electronic designs. The method may create routing grids that define multiple tessellated regions for at least a portion of a layer of an electronic design, determine an initial track pattern label or tentative track pattern label for at least one tessellated region of the multiple tessellated regions, and perform routing for the portion of the layer based at least in part upon the tentative track pattern label and/or the initial track pattern label for the at least one tessellated region. In some of these embodiments where the method creates the routing grids, the method may further identify a first shape or route in the at least the portion of the layer, wherein the first shape or route comprises a fixed shape, a detail shape, a global route, a channel route, a conduit route, or a detail route, identify at least two tessellation lines from a set of tessellation lines for the tessellation lines based at least in part upon one or more first boundary segments of the first shape, and align one or more second boundary segments of a second shape or a cell with corresponding one or more tessellation lines defining the routing grids.

In addition or in the alternative, the method may identify first tessellation lines from a first set of tessellation lines for the at least the portion of the layer, identifying a first direction for the layer, and subdivide the at least the portion of the layer by using at least the tessellation lines for creating the routing grids in the first direction. In some of these immediately preceding embodiments, the method may identify second tessellation lines from a second set of tessellation lines for one or more neighboring layers of the layer, identify a second direction for the layer, and subdivide the at least the portion of the layer by using at least the second tessellation lines for creating the routing grids in the second direction.

In some embodiments, the method may further identify a first cell for routing in the at least the portion of the layer, identify one or more boundary segments a first cell for routing in the at least the portion of the layer, and align the one or more boundary segments of the first cell with one or more corresponding grid lines of the routing grids. In addition or in the alternative, the routing grids may be adjusted by adding or removing one or more tessellation lines defining the routing grids. Moreover, the method may identify multiple candidate track patterns and multiple labels corresponding to the multiple candidate track patterns, determine rankings or consistency costs of the multiple candidate track patterns, and identify the tentative track pattern label from the multiple labels based at least in part upon the rankings or the consistency costs of the multiple candidate track patterns in some embodiments.

In performing routing for the portion of the layer, the method may determine whether or not a tessellated region is tracked or trackless, determine whether or not the tessellated region is associated with the initial track pattern label or the tentative track pattern label, identify capacity of a cell associated with the tessellated region, and identify a demand on a cell associated with the tessellated region in some first embodiments. In some of the first embodiments, the method may identify a width of a boundary segment of the cell, wherein the tessellated region is determined to be trackless, assign the width of the boundary segment to the capacity of the cell, and identify a width for a route to be implemented in the cell and a spacing value for the route.

In addition, the method may further perform the routing for the portion of the layer by implementing the route in the cell, and decrease the capacity of the cell based at least in part upon the width for the route and the spacing value for the route. In some of the first embodiments, the method may also identify a label of a track pattern associated with the tessellated region, wherein the tessellated region is determined to be tracked, identify a width for a route to be implemented in the cell, and identify a first set of tracks associated with the width in the track pattern and a total number of tracks in the first set. Moreover, the method may also perform the routing for the portion of the layer by implementing the route in the cell, and decrease the capacity of the cell based at least in part upon the total number of tracks in the track pattern and the route.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are directed to a methods, systems, and articles of manufacture for implementing high current carrying interconnects. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to or substantially trivial variations of the components referred to herein by way of illustration.

Disclosed are method(s), system(s), and article(s) of manufacture for tessellating and labeling routing space for routing electronic designs in one or more embodiments. Unless otherwise specifically recited or claimed, the terms "track pattern" and "track pattern group" may be used interchangeably to represent a collection or set of tracks in this application. It shall be noted a track referred to herein includes a routing track that is derived from the manufacturing grids that are often provided by the semiconductor foundries. The manufacture grids include reference lines with fine pitch(es) usually in the range of a few nanometer or even smaller. These manufacturing grid lines and hence the routing tracks includes merely reference lines having zero thickness as any one-dimensional lines or line segments that exhibit no thickness. The manufacturing grids and thus the tracks are used for reference purposes and are thus not printed in the fabricated electronic circuits. Therefore, the tracks have no physical presence in electronic circuits.

Figure 1:
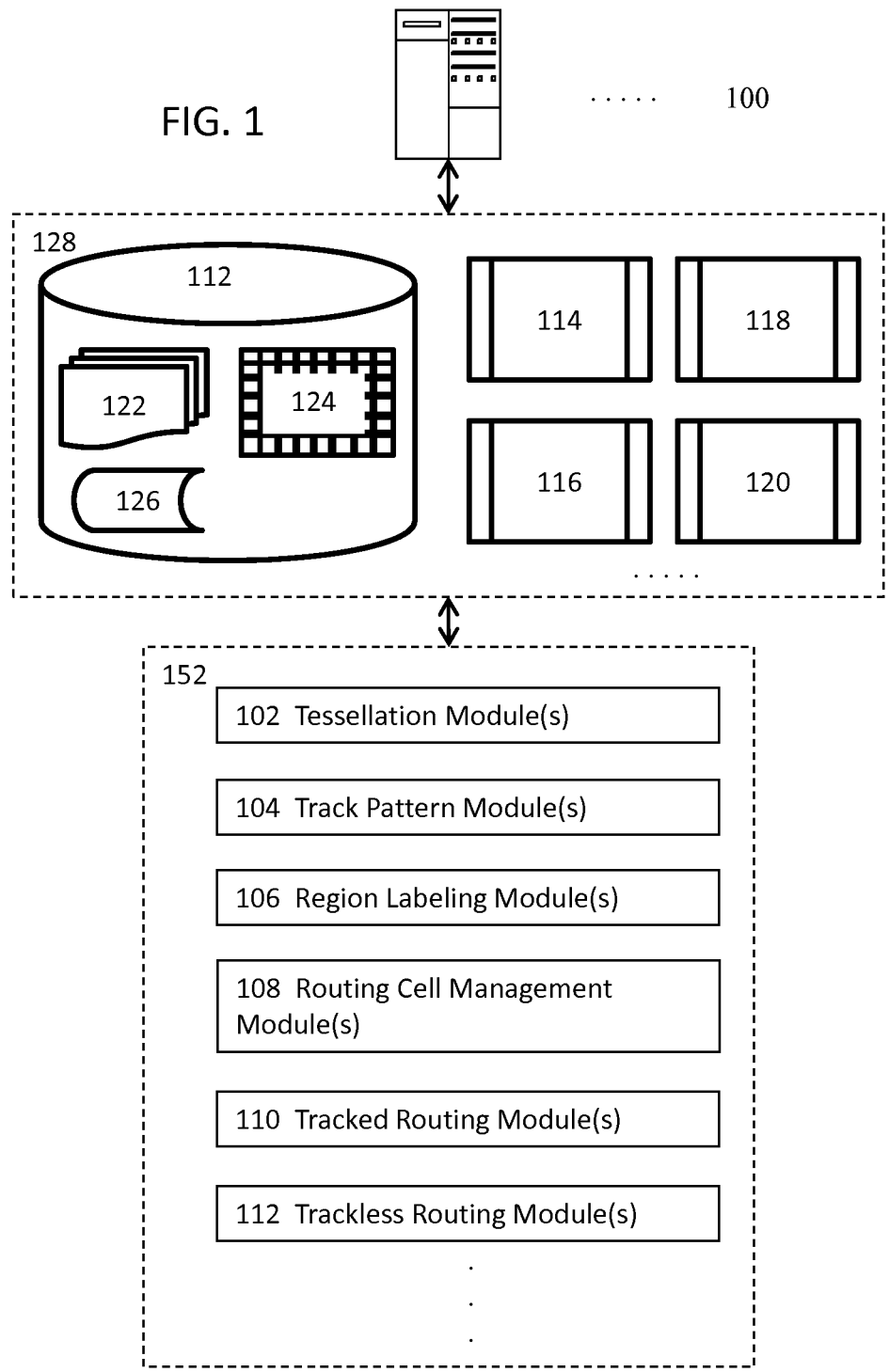
FIG. 1 illustrates a high level block diagram for a system for tessellating and labeling routing space for routing electronic designs in some embodiments.

FIG. 1 illustrates a high level block diagram for a system for tessellating and labeling routing space for routing electronic designs in some embodiments. In one or more embodiments, the system for interactively implementing physical electronic designs with track patterns may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, or a floorplanner, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more tessellation modules 102 to identify or otherwise manipulate various sets of tessellation lines of electronic designs, one or more track pattern modules 104 to manage or otherwise manipulate track patterns, one or more region labeling modules 106 to associate regions of electronic designs with track patterns or identifications thereof, either alone or jointly with one or more other modules, one or more routing cell management or manipulation modules 108 to manage or edit (e.g., add, remove, modify) routing cells (e.g., global routing cells or global cells) in electronic designs, either alone or jointly with one or more other modules, one or more tracked routing modules 110 to perform routing for tracked or gridded routing space, one or more trackless or gridless routing modules 112 to perform routing for trackless or gridless routing regions in electronic designs, etc.

Figure 2:
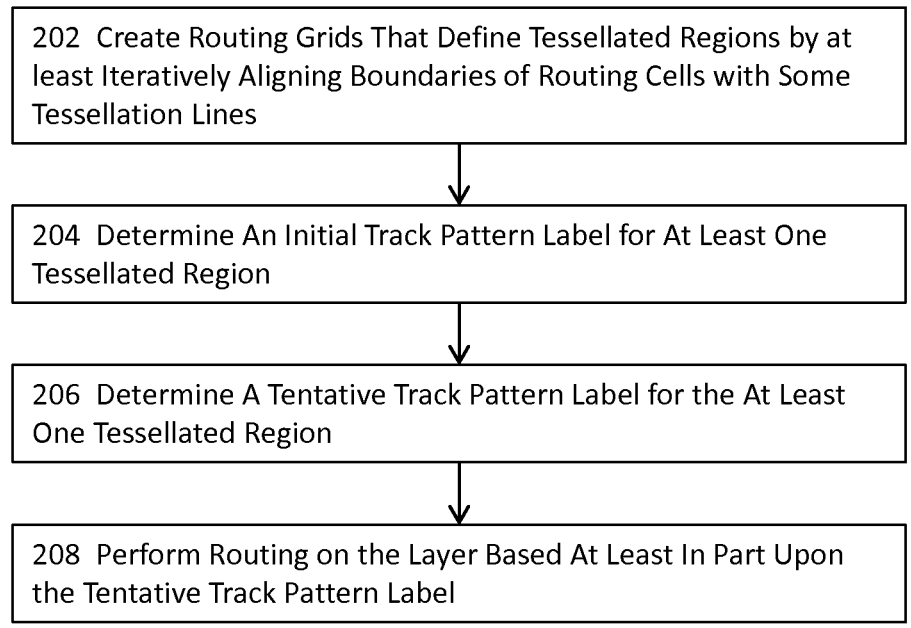
FIG. 2 illustrates a high level flow diagram for a method or system for tessellating and labeling routing space for routing electronic designs in some embodiments.

FIG. 2 illustrates a high level flow diagram for a method or system for tessellating and labeling routing space for routing electronic designs in some embodiments. In these embodiments illustrated in FIG. 2, the method or system may create routing grids that define multiple tessellated regions in a routing space (e.g., a routing layer or a portion thereof) by at least iteratively aligning boundaries or boundary segments of a routing cell (e.g., a global routing cell) with some of the tessellation lines at 202. The tessellation lines may be uniformly or non-uniformly distributed in the routing space with a constant pitch or variable pitches and may be provided or specified by customers. The routing space may include a routing layer or a portion thereof. In some embodiments, the method or system may identify the tessellation lines for creating the routing grids based at least in part upon the fixed or immovable design shape(s), detail design shape(s), or route(s) (e.g., global routes) that are already present in the routing space. For example, the method or system may identify the tessellation lines passing through the centerlines of power rails, ground rails, one or more global routes, etc. as some of the routing grids in some embodiments. In some embodiments, the routing grids created at 202 correspond to the routing cell (e.g., global cell) boundaries, and subsequently added routing cells may be moved to align their boundaries to at least some of the routing grids.

The tessellation lines may be categorized into at least two sets with the first set of tessellation lines in the preferred routing direction or right-way direction, and the second set of tessellation lines in the non-preferred routing direction or wrong-way direction. In some embodiments described herein, a routing layer may be associated with only the preferred or right-way routing direction, where wrong-way routing in the non-preferred or wrong-way direction is strictly prohibited. In some other embodiments, a routing layer may be associated with both the preferred or right-way routing direction and the non-preferred or wrong-way direction so that routing in both directions is permitted. In some of the latter embodiments, wrong-way routing may be permitted but may be further associated with a heavier penalty so as to discourage wrong-way routing in a routing layer. Routing grids include grids or grid lines (collectively "grids" hereinafter) in the right-way direction and grids in the wrong-way direction in some other embodiments. For a gridded layer where routing in both the right-way and the wrong-way direction is permitted, the routing grids include tracks in the right-way and tracks in the wrong-way direction, where both sets of tracks exist on the same routing layer. For a routing layer in which wrong-way routing is prohibited, routing grids still include the tracks in the right-way direction. Nonetheless, the grids in the wrong-way direction are no longer the tracks in the wrong-way direction on this layer because wrong-way routing is prohibited for this routing layer. Rather, the grids in the wrong-way direction may be projected, inferred, or derived from the tracks of an immediately neighboring layer. As a result, gridded designs includes tracks in both the right-way direction and the wrong-way direction. On the other hand, a tracked design includes a design having tracks only in the right-way direction but no tracks in the wrong-way direction. Therefore, a gridded design is always tracked, but the opposite is not necessarily true. On the other hand, a trackless design includes a design where there is no track at all. Therefore, a trackless design is gridless, but the opposite is also not necessarily true.

At 204, the method or system may determine or identify an initial track pattern label, identifier, or identification (collectively label hereinafter) to at least one tessellated region. In some embodiments, the method or system may identify at least one initial label of a track pattern from multiple track pattern candidates based at least in part upon the routing demand for the at least one tessellated region. For example, the routing demand may need three 1×-tracks and two 2×-tracks for a tessellated region. The method or system may thus identify a track pattern that may fulfill this routing demand and associate the label of the track pattern with the tessellated region.

It shall be noted that more than one initial track pattern candidates may be associated with or assigned to a tessellated region in some embodiments. In these embodiments, the method or system may simultaneously use these multiple track patterns to guide the implementation of the design in this tessellated region. For example, the method or system may update the respective remaining capacities of these multiple track patterns as a new route or shape (e.g., a wire, a pin, a terminal, a pad, a rail, etc.) is added to the tessellated region.

The method or system may also dynamically update the number of track patterns labels or their consistency costs or rankings associated with a single tessellated region by adding or removing one or more track pattern labels to the list of associated track pattern labels of the tessellated region. For example, the method may remove or increase the consistency cost(s) of the label(s) of track pattern(s) that does (do) not support the implementation of 2×-routes or 2×-wires in the tessellated region when a 2×-route or wire is added to the tessellated region. In addition or in the alternative, the method may add one or more labels of one or more corresponding track patterns to the list of associated track pattern labels for a tessellated region when a route or shape is forced off or removed from the tessellated region.

The method or system may use track pattern labels to guide the electronic design implementation tools. For example, the method or system may determine to treat the associated track pattern labels as a hard requirement that must be satisfied and thus force any routes or shapes (e.g., wires) that cannot be implemented with the track patterns off the associated tessellated region and subsequently re-route or re-implement such routes or shapes in some embodiments. In some other embodiments, the method or system may determine to treat the associated track pattern labels as a soft requirement that are preferred to be satisfied but need not be satisfied all the time. In these latter embodiments, the method or system may increase the consistency cost of a track pattern or a label therefor or lower the consistency ranking, order, or score of the track pattern or its label when a route or shape is added to the region that does not find an appropriate track for implementation. In yet some other embodiments, the method or system may replace the current track pattern with a different track pattern that provides appropriate tracks for implementation in the associated tessellated region.

In some embodiments, the method or system may identify or determine the label based at least in part upon the fixed or immovable design shape(s), detail design shape(s), or route(s) (e.g., global routes) that are already present in the routing space. In these embodiments, the fixed design shape(s), the detail design shape(s), or route(s) may already have some requirements for certain tracks or even some arrangement of some tracks. The method or system may thus identify or determine the label of the track pattern that may correspond to these requirements. In some embodiments where multiple track patterns may be identified for a tessellated region, the method or system may further order these multiple track patterns based on one or more criteria.

At 206, a tentative track pattern label may be determined and assigned to the at least one tessellated region. As the design further progresses, the method or system may label more tessellated regions and may also add more shapes or routes to the routing space. The method or system may thus update the initial track pattern label for the at least one tessellated region based at least in part upon the labeling of one or more neighboring regions (e.g., immediately neighboring tessellated region(s) or neighboring tessellated region(s) with intervening tessellated region(s) therebetween) and/or one or more shapes or routes in the routing space in some embodiments. For example, if the at least one tessellated region borders two 2x-regions on both sides the method or system may favor a second track pattern having five 1x-tracks and two 2x-tracks over the first track pattern having only seven 1x-tracks due to the presence of two 2x-regions immediately neighboring the at least one tessellated region.

In some of these embodiments illustrated in FIG. 2, a tentative track pattern may be determined based at least in part upon an initial track pattern for the at least one tessellated region. In these embodiments, a tentative track pattern or the label thereof may also be derived from an initial track pattern or the corresponding label thereof. An initial track pattern label for a tessellated region may be identified or determined from a set of track pattern candidate labels that meet, for example, a demand for the implementation (e.g., placement, routing, etc.) of the tessellated region in some embodiments. In some other embodiments where the tessellated region includes a pre-existing circuit design component that may provide sufficient information to determine which track patterns may be used to implement the at least one tessellated region of an electronic design, an initial track pattern label may also be determined by using such information. For example, the tessellated region may include or may be known that it will be implemented with a block or a cell of circuit components that include a pin requiring a 2x-wire. In this example, the method or system may identify a track pattern label as an initial track pattern label from a set of candidate track pattern labels that corresponds to candidate track patterns including at least one track associated with a 2x-wire.

An initial track pattern label may be updated or changed into a tentative track pattern label due to one or more changes in the tessellated region with which the initial track pattern label is associated. A tentative track pattern label may be updated or changed into an updated or different tentative track pattern label as the implementation of the at least one region further progresses because further implementation may add more requirements or change the requirements of the track pattern that may be used to implement the at least one region in some embodiments. For example, a tessellated region may be associated with an initial track pattern label based on, for example, possible inclusion (e.g., from a designer's knowledge or the specification of the electronic design) of a particular block or cell of circuit elements or a shape (e.g., a pin, terminal, port, or pad) that may be implemented in the tessellated region and require one or more certain tracks for interconnects.

Moreover, in the above example where the at least one region already includes or is known that it will be implemented with a block, a cell, or a shape which further includes a pin requiring a 2x-wire, the method or system may identify any track pattern having at least one track associated with a 2x-wire as an initial track pattern and assign the label of the initial track pattern as the initial track pattern label for the at least one region. As the implementation progresses to include one or more circuit component designs, the addition of these one or more circuit component designs may further limit the availability of and thus the choice among the candidate track pattern labels. For example, the one or more circuit component designs may require a 1x-wire, and the method or system may thus determine whether or not the currently associated initial track pattern label or tentative track pattern label meets that 1x-wire requirement and update or change the associated track pattern label accordingly to ensure that the associated track pattern label corresponds to the appropriate track pattern for the requirements.

In some embodiments where the at least one tessellated region is currently associated with an initial track pattern label, the method or system may update the initial track pattern label into a tentative track pattern label which may be further subject to change as the implementation further progresses. In some other embodiments where the at least one tessellated region is currently associated with a tentative track pattern label, the method or system may update the track pattern label into an updated or different tentative track pattern label, if needed or desired, to reflect the changes due to the progression of the implementation of the design of the at least one tessellated region.

At 208, the method or system may perform routing (e.g., global routing, channel routing, conduit routing, etc.) for the at least one tessellated region in the routing space based at least in part upon the tentative track pattern label. As a simplified example for the flow diagram illustrated in FIG. 2, the method or system may identify one or more sets of tessellations provided by, for example, semiconductor foundries or customers and identify some of the tessellation lines to partition a routing space into tessellated regions based at least in part upon, for example, power rails, ground rails, fixed design shape(s), macro(s), detail design shape(s), etc. The method or system may further align the boundary segments of one or more cells (e.g., one or more global routing cells) with the tessellation lines to reduce, minimize, or eliminate the possibility of one cell spanning across more than one tessellated regions.

The method or system may further assign an initial track pattern label to at least one tessellated region and iteratively determine the tentative track pattern label for the at least one tessellate region. A track pattern label may include information that indicates the type(s) (e.g., associated width), number(s), and/or arrangement (e.g., order of tracks in the track pattern) of tracks that may be used for routing for a tessellated region in some embodiments. At the beginning of the track pattern determination and assignment process, the method or system may select a track pattern from more track pattern candidates as, for example, an initial track pattern or a tentative track pattern because there may exist a fewer number of restrictions on track pattern selection at the beginning of the process.

The method or system may use, for example, the one or more track pattern modules to rank or order the track pattern candidates for a tessellated region. For example, either the first track pattern including seven 1×-tracks or the second track pattern including five 1×-tracks and two 2×-tracks may be selected for a tessellated region having a demand of three 1×-wires. The method or system may rank or order, for example, the second pattern higher than the first track pattern if the method or system prefers tracks associated with wider width(s) because such tracks may be used to implement thinner wires, but not vice versa. Depending on the ranking or ordering of the track pattern candidates, the method or system may identify an initial track pattern label or simply label or a tentative label for the tessellated region of interest.

It shall be noted that although a track constitutes a zero-width reference line, a 1×-track signifies that the 1×-track is associated with one unit of width (e.g., 32-nanometers for unit of width) and thus may be used to implement a wire having one unit of width. Similarly, a 2×-track signifies that the 2×-track is associated with two units of width and thus may be used to implement a wire having two units of width. On the other hand, a wire has physical, non-zero width and will be printed during manufacturing. Therefore, a 1×-wire denotes a wire having one unit of width; and a 2×-wire represents a wire having two units of width. As the routing process proceeds further, more routes will be added to a tessellated region, and thus the number of available track patterns for the tessellated region may be reduced. In the aforementioned example, if the tessellated region now has a demand for a 2×-wire, the available number of track pattern candidates for this tessellated region may thus be reduced. Although the presence of the 2×-wire may or may not necessarily render the first track pattern having seven 1×-tracks but no 2×-tracks unavailable for this tessellated region, the presence of the 2×-wire may nevertheless render the first track pattern less favorable as a track pattern candidate for this particular tessellated region. In some embodiments, the method or system may identify the second track pattern, and label the tessellated region accordingly. In some other embodiments, the method or system may nevertheless identify the first track pattern as the initial or tentative label and reallocate the demand for a 2×-wire to another region or simply reroute the 2×-wire. In this manner, the method or system may iteratively label the tessellated regions in a routing space and perform routing for the routing space by following the labels of these regions and also by rerouting certain wires until a viable routing solution is found or converges.

Figure 3:
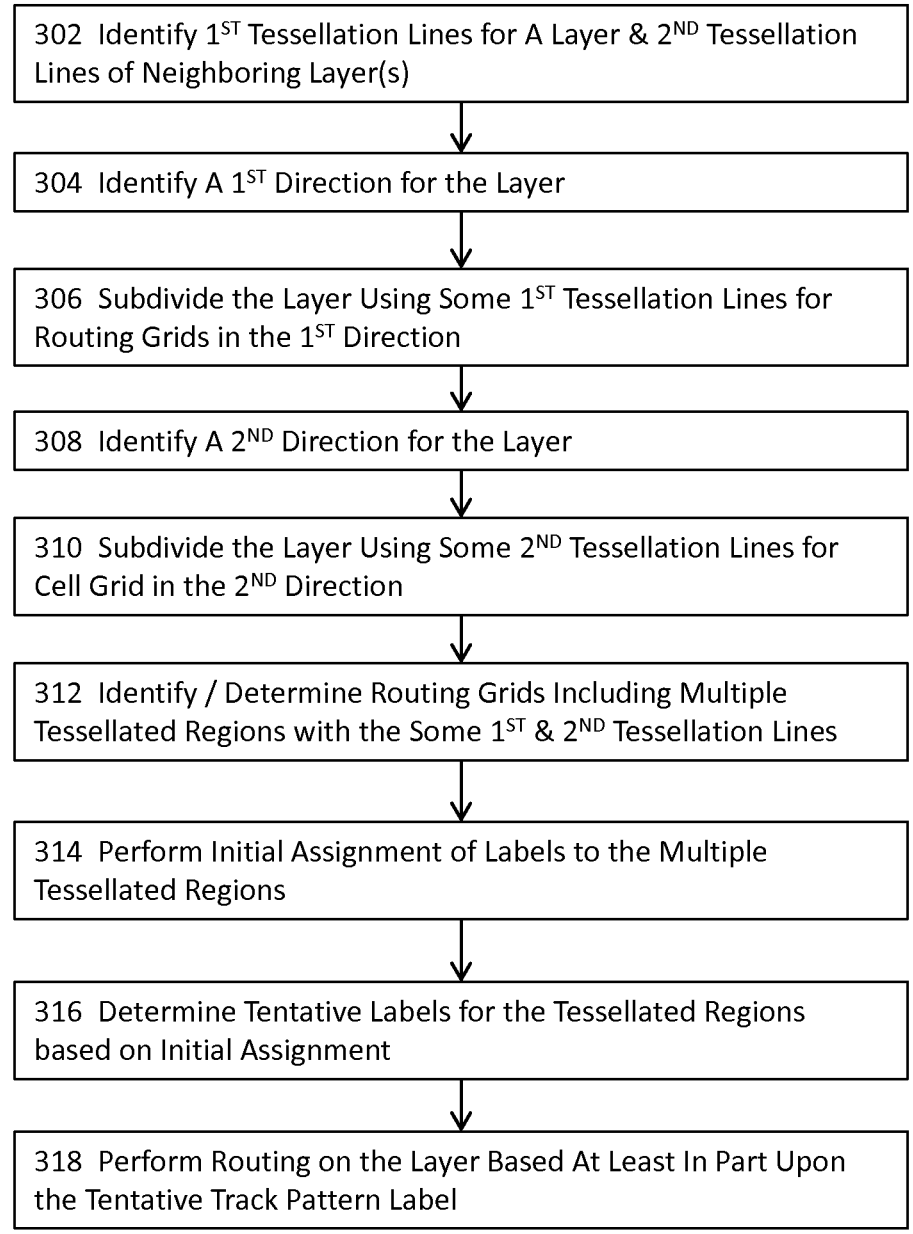
FIG. 3 illustrates a more detailed flow diagram for a method or system for tessellating and labeling routing space for routing electronic designs in some embodiments.

FIG. 3 illustrates a more detailed flow diagram for a method or system for tessellating and labeling routing space for routing electronic designs electronic designs in some embodiments. In these embodiments illustrated in FIG. 3, the method or system may identify the first tessellation lines for a layer or a portion thereof and the second tessellation lines of one or more neighboring layers of the layer at 302. In some of these embodiments, the first tessellation lines are in the first routing direction such as the preferred routing direction or right-way routing direction for the layer; and the second tessellation lines are in the second routing direction such as the preferred routing direction or the right-way routing direction for an immediately neighboring layer of the layer. With this naming convention for routing directions, the right-way routing direction for the immediately neighboring layer will be the wrong-way routing direction for the layer.

It shall be noted that these embodiments illustrated in FIG. 3 are based upon the assumption that wrong-way routing is not permitted on a routing layer. Nonetheless, the techniques described herein apply to the embodiments where wrong-way routing is also permitted with full and equal effects. In these embodiments, for example, the method or system may thus identify the first tessellation lines in the first routing direction and the second tessellation lines in the second routing direction of the same layer. At 304, the first routing direction may be identified for the layer or the portion thereof identified at 302. For example, the method or system may identify the preferred routing direction or the right-way routing direction for the layer at 304.

The method or system may then subdivide the layer or the portion using the first tessellation lines for routing grids in the first direction at 306. In some embodiments, the first tessellation lines may be provided by customers or inputted by a user and have a finer pitch that is smaller than, for example, the widths or lengths of routing cells (e.g., global cells). The method or system may thus identify or select some but not necessarily all of the first tessellation lines as routing grids in the first direction. The subdivision of the layer or the portion using some of the first tessellation lines may depend on one or more criteria. For example, the method or system may identify the boundaries of existing shapes (e.g., fixed shapes, detail shapes, etc.) along the first direction in the layer or the portion thereof, and identify the corresponding first tessellation lines as a part of the routing grids to subdivide the layer or the portion thereof in the first direction.

At 308, the method or system may identify a second direction for the layer. In some embodiments, the second direction includes the wrong-way routing direction of the layer or the right-way direction of an immediately neighboring layer. The method or system may further subdivide the layer or the portion thereof by using some of the second tessellation lines at 310. For example, the method or system may identify the boundaries of existing shapes (e.g., fixed shapes, detail shapes, etc.) along the second direction in the layer or the portion thereof, and identify the corresponding second tessellation lines as another part of the routing grids to subdivide the layer or the portion thereof in the second direction.

At 312, the method or system may identify or determine the routing grids that form multiple tessellated regions in the layer or the portion thereof. When a new cell (e.g., a global routing cell) is introduced or added into the layer or the portion thereof, the method or system may first attempt to align all four boundary segments of the new cell with the existing grids by moving the new cell. In some embodiments where at least one boundary segment of the new cell cannot be aligned with the existing routing grids, the method or system may further adjust the routing grids by, for example, identifying one or more tessellation lines that are not yet a part of the existing grids and adding the one or more tessellation lines into the existing routing grids removing one or more existing tessellation lines from the existing routing grids, or any combinations thereof such that the boundary segments of the newly introduced cell are aligned with some tessellation lines in the routing grids. By aligning boundary segments of cells with the routing grids, the method or system create tessellated regions for the cells in the layer and avoids or reduces the possibility of having one cell reside in more than one tessellated region in some embodiments. Having one cell reside in more than one tessellated region may further complicate the association of track patterns with the cell or assignment of one or more track pattern labels to the cell, where the track pattern label or association will be used to guide a router (e.g., a global router) to route the layer.

At 314, the method or system may perform initial assignment of track pattern labels to the multiple tessellated regions. For example, the method or system may assign an initial track pattern label to a tessellated region based at least in part upon one or more existing shapes (e.g., a fixed shape, a detail shape, etc.) and/or one or more existing routes (e.g., a global route, a conduit route, etc.) in some embodiments. In addition or in the alternative, the method or system may also determine or identify the initial track pattern label based at least in part upon, for example, the routing demand for the cell that may be located in the particular tessellated region in some embodiments. For example, a cell may be associated with a routing demand including three 1×-wires and one 2×-wire. The method or system may thus identify one or more track patterns that may fulfill at least a part of the demand.

For example, the method may identify a first track pattern including five 1×-tracks and two 2×-tracks and a second track pattern including seven 1×-tracks for this particular cell. It shall be noted that although the second track pattern does not include any 2×-tracks to meet the requirement of a 2×-wire, the second track pattern may nevertheless be a candidate track pattern for assignment to the cell because there may be situations where the particular cell is situated in the design that may not easily allow having 2×-wires in this particular cell in this tessellated region. In those embodiments where the second track pattern is assigned to the tessellated region, the 2×-wire may need to be rerouted on the same layer or across multiple layers with the use of vias.

An alternative solution is to relocate the cell to another tessellated region to which a track pattern label including at least one 2×-track may be assigned. In some embodiments, the method or system may further rank or order these track patterns and perform the initial assignment according to the ranks or orders of these track patterns. In the above example, the method or system may rank, for example, the first track pattern higher than the second track pattern due to, for example, the presence of 2×-tracks in the first track pattern. The method or system may thus assign the first track pattern label to this tessellated region. At 316, the method or system may determine or identify tentative labels for at least some of the multiple tessellated regions based at least in part upon the initial assignment of track pattern labels. The tentative track pattern label for a tessellated region may be identified or determined based at least in part upon the cell or the demand therefor allocated to the tessellated region of the multiple tessellated regions in some embodiments.

In addition or in the alternative, the tentative track pattern label may be identified or determined for the tessellated region based at least in part upon one or more shapes (e.g., detail shapes) or routes (e.g., global routes, channel routes, conduit routes, or detail routes, etc.) already present in the tessellated region or in one or more neighboring tessellated regions of the tessellated region under consideration. For example, as the design implementation progresses, more shapes and routes may be added to various parts of the layer under consideration. These shapes or routes may have already been associated with certain characteristics (e.g., widths of wires, etc.) that may affect future association of track pattern to a tessellated region.

For example, the existence of a 2×-global route in an immediately neighboring tessellated region is a factor to consider when the method or system assigns a tentative track pattern label to the tessellated region because certain design rules or designer's choice may preclude or disfavor the use of vias to route the 2×-global route in the immediately neighboring layer to another layer and thus require or prefer a 2×-track in the tessellated region under consideration. In some embodiments, the process of determining or identifying tentative track pattern labels for some tessellated regions is thus an iterative process. In these embodiments, some tentative labels may continue to change as the design process progresses. At 318, the method or system may perform routing (e.g., global routing, channel routing, conduit routing, or detail routing, etc.) on the layer or the portion thereof based at least in part upon the tentative track pattern labels. More details about performing routing with the tentative track pattern labels will be described in subsequent paragraphs.

Figure 4A:
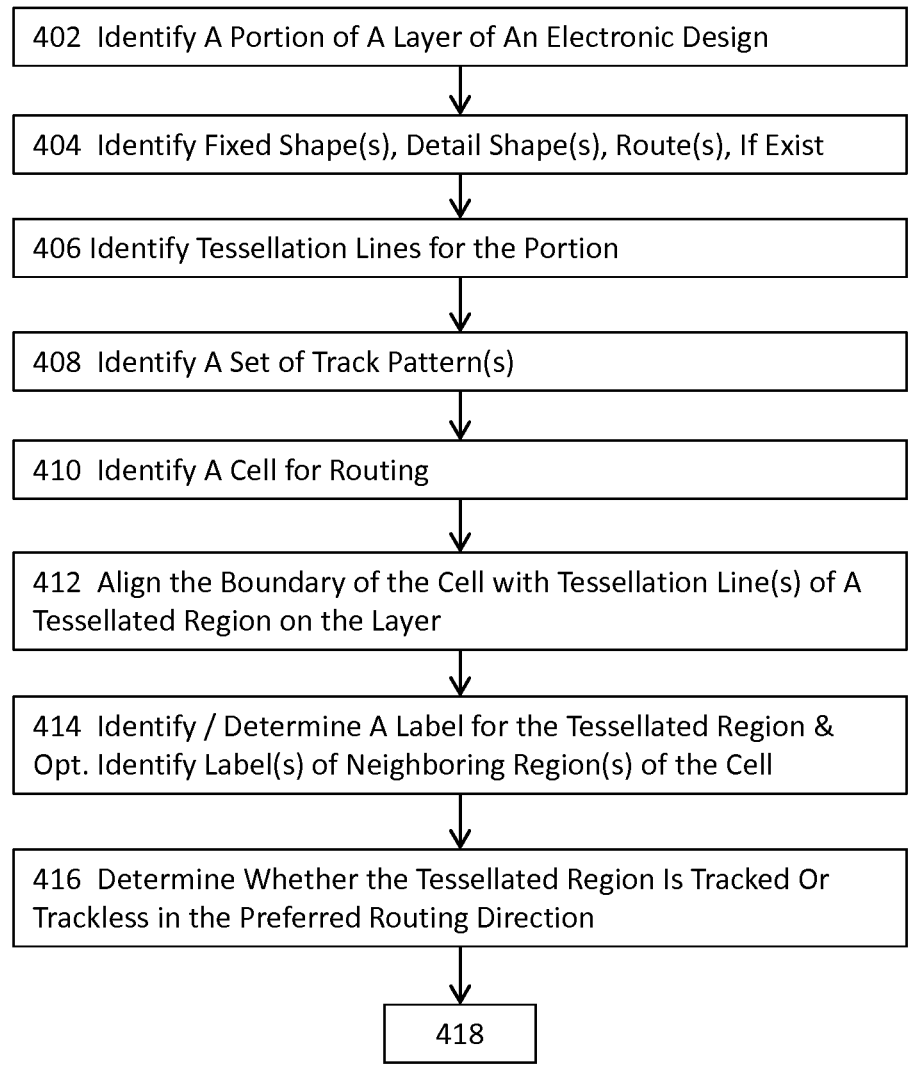
FIGS. 4A-B jointly illustrate a more detailed flow diagram for a method or system for tessellating and labeling routing space for routing electronic designs in some embodiments.
Figure 4B:
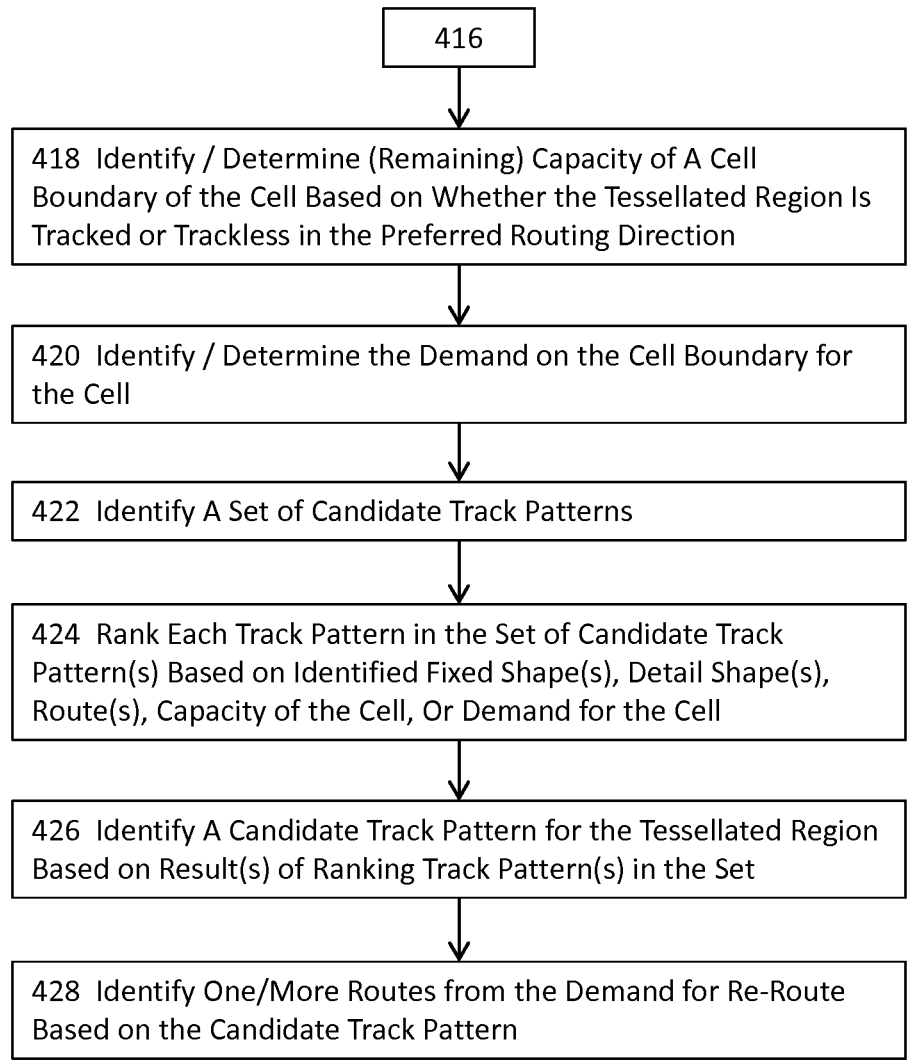

FIGS. 4A-B jointly illustrate a more detailed flow diagram for a method or system for tessellating and labeling routing space for routing electronic designs in some embodiments. In these embodiments, the method or system may identify a layer or a portion thereof of an electronic design at 402. At 404, the method or system may identify one or more fixed shapes, detail shapes, and/or routes (e.g., one or more global routes, channel routes, conduit routes, detail routes, or any combinations thereof that already exist in the layer or the portion thereof. The method or system may identify tessellation lines at 404. In some embodiments, the tessellation lines may be identified based at least in part upon the one or more fixed shapes, detail shapes, and/or routes identified at 402.

In some embodiments, the tessellation lines may include tessellation lines in the first routing direction and/or the second routing direction, although having two routing directions does not necessarily indicate or imply that the routing layer identified at 402 may or may not allow routing in both the first routing direction and in the second routing direction. The method or system may then identify tessellation lines for the portion of the layer at 406 and a set of track patterns at 408. Some customers or foundries provide some track patterns as the only permissible track patterns in one or more layers of electronic designs together with a set of corresponding design rules related to these track patterns. At 410, a cell may be identified for routing in the portion of the electronic design. In some embodiments, a cell may include a global cell. The method or system may first align one or more boundary segments of the cell with the tessellation lines identified at 408 of a tessellated region at 412.

In some embodiments, the method or system aligns all of the boundary segments of a newly added cell to the tessellation line segments of a tessellated region to reduce or eliminate the possibility of having one cell reside in more than one tessellated region. At 414, the method or system may identify or determine a track pattern label for the tessellated region to which the cell may be assigned. In some embodiments, the method or system may identify or determine a track pattern label for the tessellated region based at least in part upon one or more labels of one or more neighboring tessellated regions. In some of these embodiments, the method or system may optionally identify the track pattern labels assigned to or associated with one or more neighboring regions of the tessellated region to which the cell will be assigned. In some embodiments, the method or system identifies the immediately neighboring tessellated regions and/or other neighboring tessellated regions along the routing direction (e.g., the right-way routing direction or the preferred routing direction) in the same routing layer.

In some other embodiments, the method or system identifies the immediately neighboring tessellated regions and/or other neighboring tessellated regions along both the right-way routing direction and the wrong-way routing direction in the same routing layer. In yet some other embodiments, the method or system identifies the immediately neighboring tessellated regions and/or other neighboring tessellated regions along at least one routing direction in the same routing layer as well as one or more neighboring tessellated regions in one or more neighboring routing layers of the routing layer. At 416, the method or system may determine whether the tessellated region is tracked or trackless in the preferred routing direction or the right-way routing direction.

A tracked tessellated region in the right-way routing direction includes one or more tracks along the right-way routing direction. In this context, a tracked tessellated region may or may not be gridless because there may not be any tracks in the wrong-way routing direction. Similarly, a trackless tessellated region in the right-way direction includes no tracks in the region along the right-way routing direction. A trackless tessellated region may nevertheless include some tracks in the wrong-way routing direction in some embodiments. In other embodiments, a tessellated region that is trackless in the right-way routing direction may also have no tracks in the wrong-way direction and is thus a trackless region.

At 418, the method or system may identify or determine the capacity of a boundary segment or edge of the cell based at least in part upon whether or not the tessellated region is tracked or trackless in the right-way routing direction. It shall be noted that the terms "boundary segment" and "edge" of a cell may be used interchangeably throughout this application. The capacity of a cell (e.g., a global cell) may be assessed at an edge of the cell. In some embodiments where the tessellated region is tracked, the capacity of the cell as defined by the tessellated region may be assessed by examining the number(s) of different tracks still available for the cell. For example, a tessellated region may be associated with a first track pattern including five 1×-tracks and two 2×-tracks; and the tessellated region may have already included one 1×-route and one 2×-route. In this example, the capacity or the remaining capacity of this cell at this point is four 1×-tracks and one 2×-track.

In some embodiments where the tessellated region is trackless in the right-way routing direction, the capacity may be determined by subtracting the width(s) of route(s) and the spacing value(s) in the tessellated region from the total width of the cell (or the length of the edge) defined by the tessellated region. For example, if the width of the cell is 1000 nanometers, and there are one 65-nanometer route having 65-nanometer spacing from adjacent routes and one 130-nanometer route having 65-nanometer spacing from adjacent routes in the cell, the capacity or remaining capacity of the edge is therefore $[1000-(65+130+\frac{1}{2}\times65\times2+\frac{1}{2}\times65\times2)]=675$ (nanometers). In other words, for cells in tracked tessellated regions, the capacity of a cell may be determined by the number of available tracks. For cells in trackless tessellated regions, the capacity of a cell may be determined by the width of the cell or the length of the edge of the cell in the other routing direction (e.g., the wrong-way direction). As it may be seen from the above examples, a trackless region may provide more flexibility or more capacity for routing purposes then a tracked region because once the available tracks are consumed, the corresponding cell is determined to have zero capacity, but there may in fact have enough space to accommodate more route(s) if the trackless approach is employed.

At 420, the method may identify or determine the demand on the cell boundary segment of the cell. For example, the method or system may identify the demand on the cell to be three 1×-routes and one 2×-route, while the tessellated region defining the cell is associated with a track pattern having five 1×-tracks and two 2×-tracks. As previously described, there may be more than one track pattern that may be associated with a tessellated region in some embodiments. In these embodiments, the method or system may further identify a set of candidate track patterns at 422. These candidate track patterns may be ranked or ordered based at least in part upon one or more criteria at 424. The one or more criteria may include, for example, one or more existing fixed shapes, one or more existing detail shapes, one or more routes in the tessellated region, the capacity of the cell, the demand on the cell, and/or the track pattern labels of one or more neighboring tessellated regions in the same routing layer or in different routing layers.

At 426, the method or system may identify a candidate track pattern from the set of track patterns based at least in part upon the results of ranking or ordering the set of track patterns. The method or system may rank or order multiple track patterns based at least in part upon one or more criteria. In some embodiments, the one or more criteria include, for example, preference or bias toward wider tracks associated with larger widths or thinner tracks associated with smaller widths, the types of signals running in the eventual wires as guided by the routes (e.g., power, ground, clock signals, etc.), the criticality of the nets build upon the routes, performance requirements, reliability requirements favoring wider tracks associated with larger widths, noise, electro-migration, or other design requirements, design choice, heuristics, historical data from other identical or similar designs, one or more design rules, or any combinations thereof. In some embodiments where the associated or assigned candidate track pattern label does not entirely fulfill the demand, the method or system may optionally identify one or more routes for subsequent re-route based at least in part upon the candidate track pattern label at 428. For example, if a tessellated region is associated with a track pattern including seven 1×-tracks, and the demand includes five 1×-routes and one 2×-route, the method or system may identify the 2×-route for subsequent re-route because the associated track pattern label indicates that the tessellated region is not associated with any 2×-track to fulfill the demand of the 2×-route.

Figure 5A:
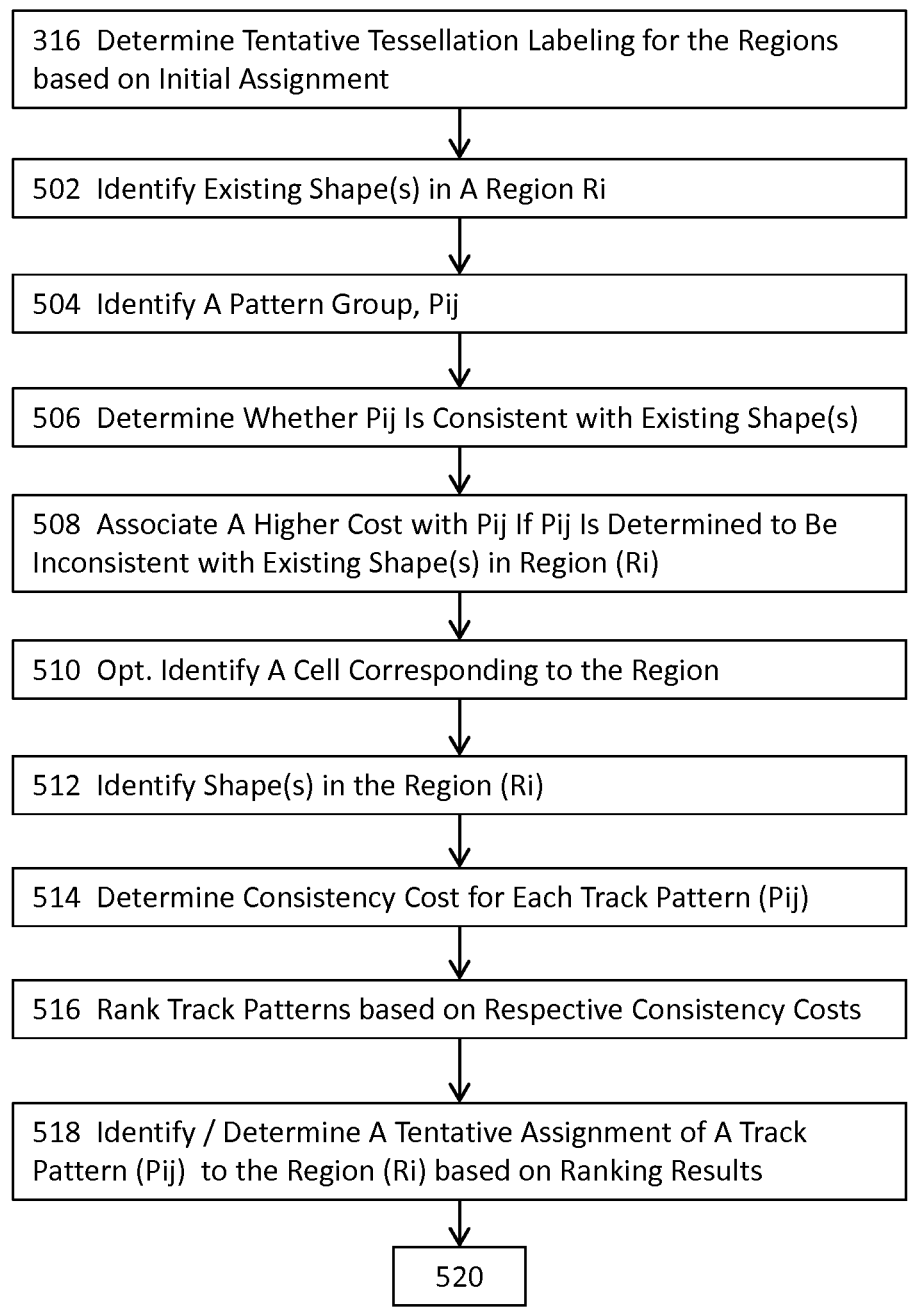
FIGS. 5A-B jointly illustrates a more detailed level flow diagram for a method or system for tessellating and labeling routing space for routing electronic designs in some embodiments.
Figure 5B:
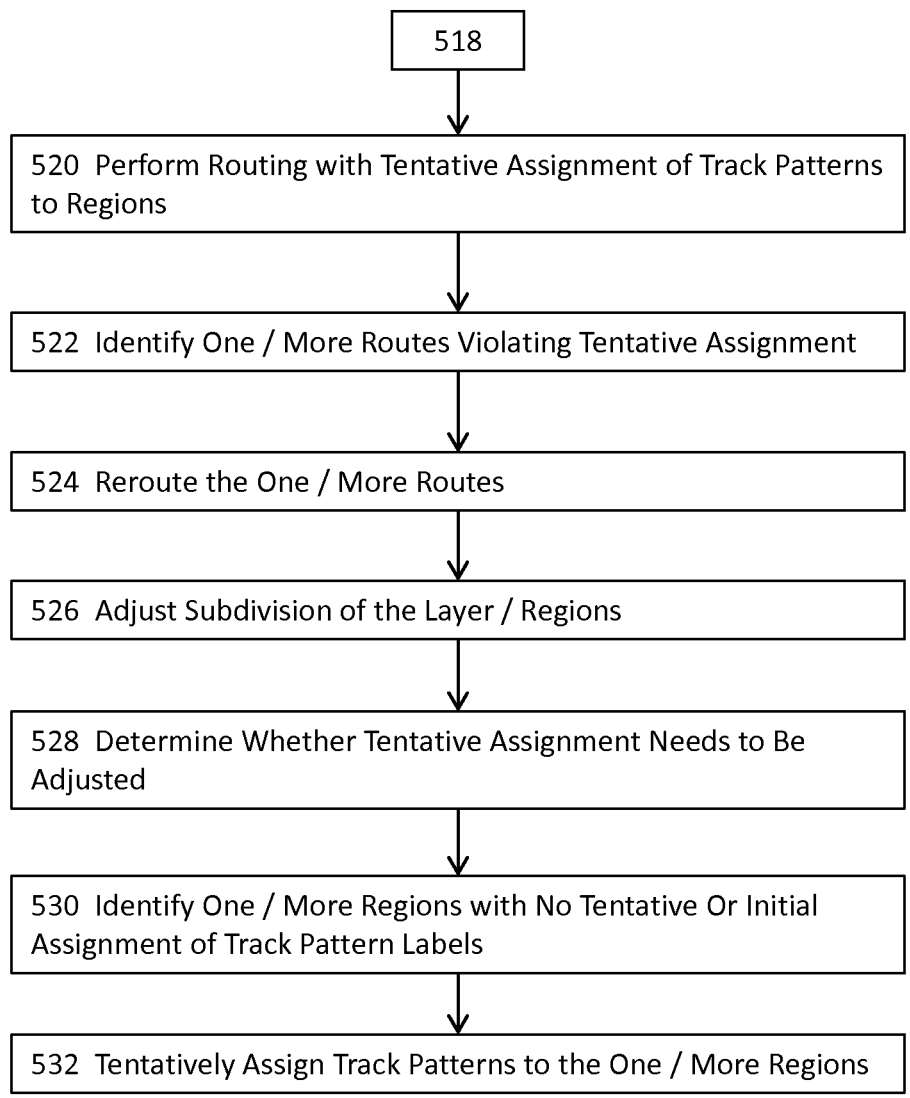

FIGS. 5A-B jointly illustrates a more detailed level flow diagram for a method or system for tessellating and labeling routing space for routing electronic designs in some embodiments. More specifically, FIGS. 5A-B illustrate more details about the process or module 316 for determining tentative labels for tessellated regions. In these embodiments, the method or system may identify one or more existing shapes in a tessellated region Ri at 502 and a track pattern, Pij, at 504. The method or system may then determine whether or not the track pattern, Pij, is consistent with the one or more existing shapes in the tessellated region, Ri, at 506. For example, the method or system may identify the routes (e.g., global routes, channel routes, conduit routes, detail routes, etc.) that already exist in the tessellated region and determine whether the widths associated with these routes are consistent with the identified track pattern as indicated by the label. As another example, a 3×-route existing in a tessellated region is determined to be inconsistent with a track pattern including only 1×- and 2×-tracks.

At 508, the method or system may associate a higher cost with the track pattern Pij if it is determined that the track pattern Pij is inconsistent with any existing shapes for the tessellated region Ri. The method or system may also optionally identify a cell that corresponds to the tessellated region Ri at 510. A cell corresponds to a tessellated region if the tessellated region defines the boundaries of the cell, or if the cell is moved or otherwise adjusted to align with the tessellation line segments of the tessellated region in some embodiments. The method or system may further identify one or more existing shapes in the tessellated region Ri at 512 and determine the consistency cost for each track pattern based at least in part upon the one or more existing shapes at 514.

For example, the method or system may identify one or more routes (e.g., global routes, channel routes, conduit routes, etc.) that are non-topological features and/or one or more detail shapes (e.g., detail wires) that are topological features and determine whether the track pattern includes the requisite tracks associated with appropriate widths for implementing these routes and/or shapes. If a track pattern is determined not to include one or more requisite tracks for implementing these one or more routes and/or shapes, the method or system may determine a higher consistency cost for the track pattern. In some embodiments, the more requisite tracks a track pattern lacks, the higher consistency cost will be associated with the track pattern.

At 516, the method or system may thus rank or order multiple track patterns based at least in part upon their respective consistency costs. At 518, the method or system may identify or determine a tentative assignment of a track pattern to the tessellated region Ri based at least in part upon the ranking or ordering results. At 520, the method or system may perform routing for the region by using the tentative assignment of track patterns to tessellated regions as a guide to the router. The method or system may further identify one or more routes which, when generated, violate the tentative track pattern assignment at 522 and may re-route these one or more routes at 524. In some embodiments where not all boundary segments of a cell may be practically aligned with the tessellation lines, the method or system may optionally adjust the subdivision of the layer or a portion thereof at 526. For example, the method or system may identify one or more other tessellation lines or tessellation line segments to replace one or more existing tessellated regions with one or more new tessellated regions or to further subdivide an existing tessellated region into multiple, smaller tessellated sub-regions in some embodiments.

In some embodiments, the method or system may adjust the subdivision of the layer or a portion thereof based at least in part upon one or more criteria. These one or more criteria may include, for example, an objective or requirement to have a routing cell occupy no more than one tessellated region. At 528, the method or system may determine whether the tentative labels need to be adjusted for one or more tessellated regions. For example, the method or system may first identify a tentative track pattern label from multiple track pattern candidate labels and associate the tentative track pattern label with a tessellated region. As the design implementation progresses, the earlier tentative track pattern label may be less suitable or desirable for the tessellated region. In some embodiments where multiple track pattern candidates are ranked or ordered to have their respective consistency scores, rankings, or orders, the currently associated track pattern label may now have a lower score, ranking, or order when compared with other track pattern candidates.

The method or system may thus adjust the tentative track pattern label associated with or assigned to the tessellated region. Therefore, the method or system may iteratively adjust the tentative track patter labels associated with or assigned to the tessellated regions in some of these illustrated embodiments. In some embodiments where there exist one or more tessellated regions that have not been associated with any initial or tentative track pattern labels, the method or system may further identify these one or more tessellated regions at 530. The method or system may further assign one or more tentative track pattern labels to these one or more tessellated regions at 532 based at least in part upon, for example, the content (e.g., shape(s), route(s), etc.) of the current electronic design, the tentative or initial track pattern labels of one or more neighboring tessellated regions in the same layer or in one or more different layers, the respective capacities of cells associated with corresponding tessellated regions, the demands on cells associated with corresponding tessellated regions, the demands on, the number or types of routes that need to be re-routed, one or more design rules, objectives, constraints, or requirements, the design choice of designers, or any combination thereof in some embodiments.

Figure 6:
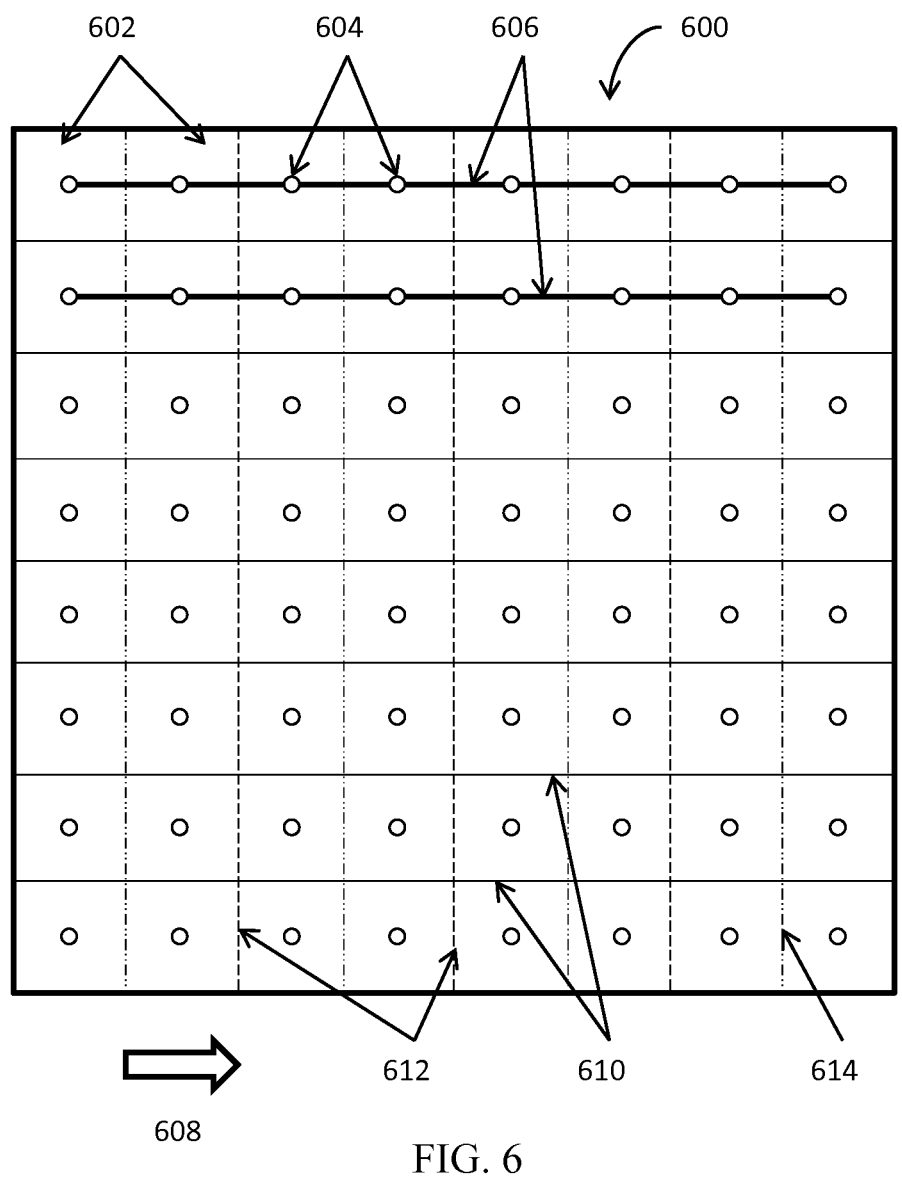
FIG. 6 illustrates a portion of a routing layer and routing cells of an illustrative electronic design in some embodiments.

FIG. 6 illustrates a portion of a routing layer and routing cells of an illustrative electronic design in some embodiments. More specifically, FIG. 6 illustrates a routing layer or a portion thereof 600 including the routing cell grids in some embodiments. The routing cell grids are defined by the first tessellation lines 610 in the first routing direction 608 and the second tessellation lines 612 and 614 in the second routing direction. In some of these illustrated embodiments, the first routing direction 610 may include the right-way routing direction of the layer or the portion thereof 600. The second routing direction 612 or 614 may include the wrong-way routing direction of the layer or the portion 600 or the right-way routing direction of an immediately neighboring layer of the layer or the portion 600. In some embodiments, the second tessellation lines 612 may be identified from a neighboring layer (e.g., the immediately neighboring layer below the current layer) of the current layer, and the second tessellation lines 614 may be identified from another neighboring layer (e.g., the immediately neighboring layer atop the current layer) of the current layer.

The rectangular boxes enclosed by four tessellation line segments represent routing cells 602 in the layer or the portion thereof 600. Each routing cell 602 is enclosed by the respective tessellation line segments (610 and 612 or 614). A routing cell 602 may also include a reference center point or a vertex 604, and neighboring routing cells 602 may be connected via edges 606 which include reference line segments connecting the vertices 604 of two or more routing cells 602 that have one or more routes running through. In some embodiments, the vertices 604 and edges 606 may be used in determining or constructing a two-dimensional connected graph for the layer or the portion thereof. The method or system may further construct or determine one or more three-dimensional connected graphs by using edges connecting vertices in two different layers as the third dimension, in addition to the two-dimensional edges on the same routing layer. Moreover, the method or system may associate the routing capacity and/or routing demand with one of the four edges or boundary segments (e.g., the left edge) of a routing cell 602.

Figure 6A:
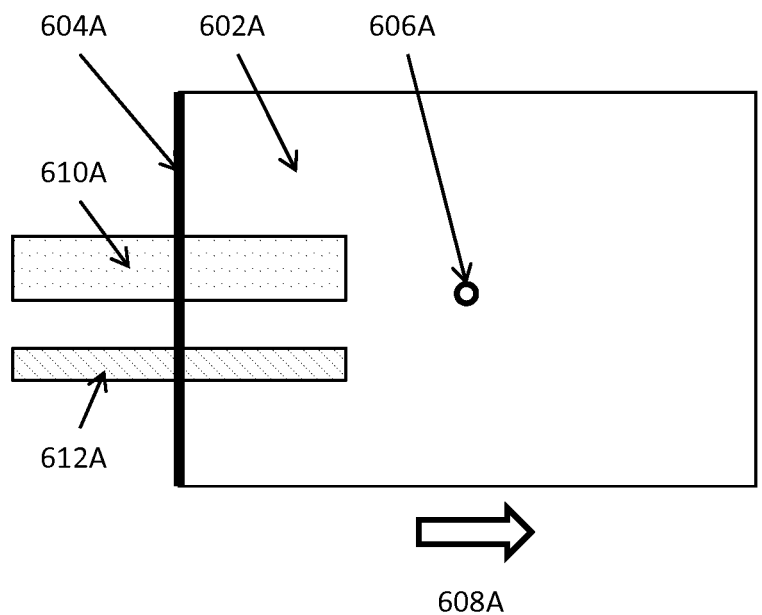
FIG. 6A illustrates a gridless or trackless routing approach for a routing cell in some embodiments.

FIG. 6A illustrates a gridless or trackless routing approach for a routing cell in some embodiments. More specifically, FIG. 6A illustrates a trackless region 602A with a left boundary segment 604A, a vertex 606A, and the right-way routing direction 608A. FIG. 6A further illustrates routing two routes (e.g., global routes, channel routes, or conduit routes) or wires (e.g., detail wires)—a 2×-route or wire 610A and a 1×-route or wire 612A. In the embodiments where the tessellated region 602A is trackless, the method or system may associate the routing capacity and the routing demand with one of the four boundary segments (e.g., the left boundary segment 604A) or the vertex (606A). For example, the method or system may consider the length of the left boundary segment 604A as the routing capacity. Every time a route or wire is added to the design, the method or system may calculate the routing demand as the width of the route or wire plus two one-halves of the spacing values (one one-half of a spacing value on each side of the wire or route). The method or system may further determine the remaining capacity by subtracting the routing demand from the routing capacity.

Figure 6B:
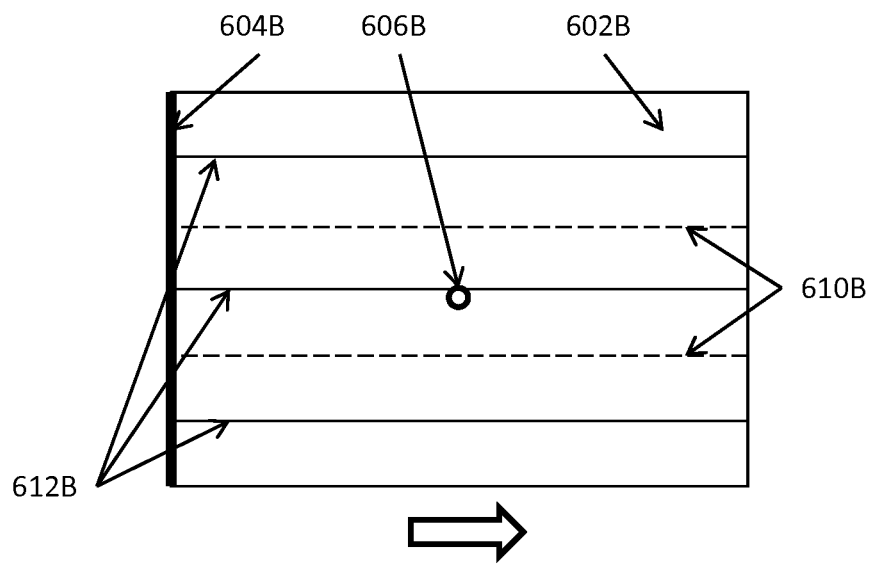
FIG. 6B illustrates a gridded or tracked routing approach for a routing cell in some embodiments.

FIG. 6B illustrates a gridded or tracked routing approach for a routing cell in some embodiments. More specifically, FIG. 6B illustrates a tracked tessellated region 602B having a left boundary segment 604B, a vertex 606B, and the right-way routing direction 608B. FIG. 6B further illustrates that the tessellated region is associated with a track pattern including three 1x-tracks 612B and two 2x-tracks 610B. The method or system may associate the routing capacity and the routing demand with one of the four boundary segments (e.g., the left boundary segment 604B) or the vertex (606B). For this tracked tessellated region 602B, the method or system may identify or determine the initial routing capacity to be the numbers and types of tracks available when no routes or wires have been added to the tracked tessellated region 602B. In this example, the initial routing capacity is three 1x-tracks and two 2x-tracks. As the design progresses, the method or system may determine the remaining capacity by decreasing the counts of the available tracks according to the types of routes or wires being added to the tracked, tessellated region 602B. For example, if a 1x-route (e.g., global route) is added to the tracked, tessellated region 602B, the method or system may determine the remaining capacity to be two 1x-tracks (reduced from three 1x-tracks) and two 2x-tracks.

Figure 6C:
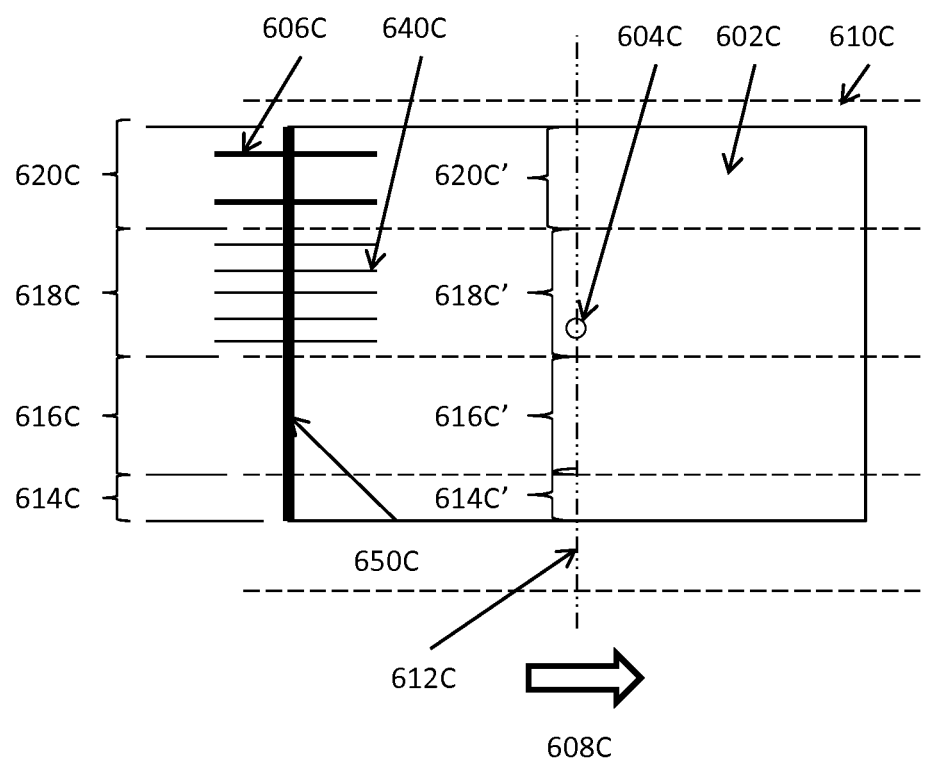
FIG. 6C illustrates a routing approach for a routing cell having subdivided edge segments in some embodiments.

FIG. 6C illustrates a routing approach for a routing cell having subdivided edge segments in some embodiments. More specifically, FIG. 6C illustrates that the method or system may further subdivide a boundary segment of a routing cell into multiple sub-segments and associate different routing capacities and routing demands with these multiple sub-segments in some embodiments. In some embodiments, this approach may apply to the situation where a routing cell occupies more than one tessellated region in a layer of an electronic design. For example, the routing cell 602C in FIG. 6C occupies more than one tessellated regions defined by the tessellation lines 610C and 612C.

For example, the routing cell 602C in FIG. 6C includes the right-way routing direction 608C, the vertex 604C, and the left boundary segment 650C. The left boundary segment 650C may be subdivided into four sub-segments 614C, 616C, 618C, and 620C. Each of the four sub-segments may be associated with its respective routing demand and routing capacity. For example, sub-segment 620C may be associated with its own routing capacity and routing demand. If the tessellated region in which sub-segment 620C resides is associated with a first track pattern label, the routing capacity and routing demand associated with sub-segment 620C may be determined in a substantially similar manner as that described for FIG. 6B.

Similarly, sub-segment 618C may also be associated with its own routing demand and routing capacity. For example, if the tessellated region in which sub-segment 620C resides is associated with the label of the first track pattern including two 2x-tracks and three 1x-tracks, and if there are already two 2x-routes or wires 606C going through the sub-segment 620C into the routing cell 602C, the routing demand will be decreased to three 1x-tracks and zero 2x-track. In some embodiments where the tessellated region in which sub-segment 618C resides is associated with a second track pattern label, the routing capacity and routing demand associated with sub-segment 620C may be determined in a substantially similar manner as that described for FIG. 6B. For example, if the tessellated region in which sub-segment 618C resides is associated with the label of the second track pattern including two 2x-tracks and seven 1x-tracks, and if there are already five 1x-routes or wires 640C going through the sub-segment 618C into the routing cell 602C, the routing demand will be decreased to two 1x-tracks and two 2x-tracks.

In addition or in the alternative, FIG. 6C illustrates that the method or system may infer routing capacities and routing demands for boundary segments of tessellated regions within a routing cell from the routing capacities and routing demands associated with a boundary segment of the routing cell. For example, for the tessellated region having the left boundary segment 620C', the routing capacity and the routing demand for the left boundary segment 620C' may be inferred or extrapolated from the boundary segment 620C. Similarly, the routing capacities and routing demands of the sub-segments 614C', 616C', and 618C' may be inferred or extrapolated from the sub-segments 614C, 616C, and 618C respectively. In some of these illustrated embodiments, the method or system may infer or extrapolate the routing capacity of and routing demand on sub-segment 614C' to be those of sub-segment 614C. In some other embodiments, the method or system may infer or extrapolate the routing capacity of and routing demand on sub-segment 616C' (or 614C', 618C', 620C') to be those of sub-segment 614C (or 614C, 618C, 620C) times a multiplier. In some of these latter embodiments, the multiplier is less than one.

Figure 6D:
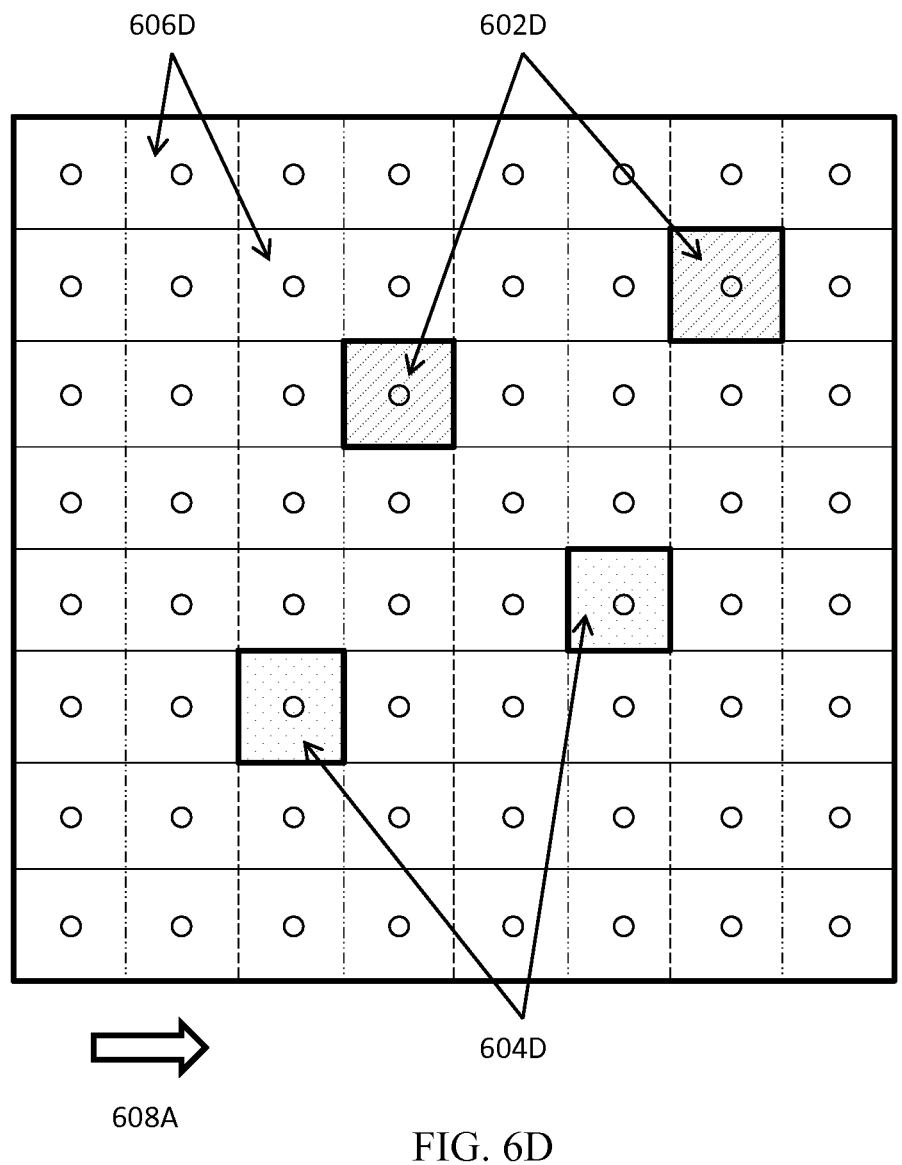
FIG. 6D illustrates a routing space including both tracked or gridded region(s) and trackless or gridless region(s) in some embodiments.

FIG. 6D illustrates a routing space including both tracked or gridded region(s) and trackless or gridless region(s) in some embodiments. More specifically, FIG. 6D illustrates that the routing space includes tracked tessellated regions 602D associated with the first label of the first track pattern including 2x-tracks and tracked tessellated regions 604D associated with the second label of the second track pattern including 1x-tracks. The routing space illustrated in FIG. 6D also includes trackless tessellated regions 606D. As described above, the method or system may use the width or the size of a trackless, tessellated region or a routing cell associated therewith as the initial routing capacity and determine the remaining capacity by using the width(s) of the routes or wires and spacing values. The method may use the types (e.g., associated widths) and numbers of the tracks of the associated track patterns as the initial routing capacities of tracked tessellated regions and determine the remaining capacities by decreasing the numbers of corresponding tracks as new routes or wires associated with their respective widths are added to the design.

Figure 6E:
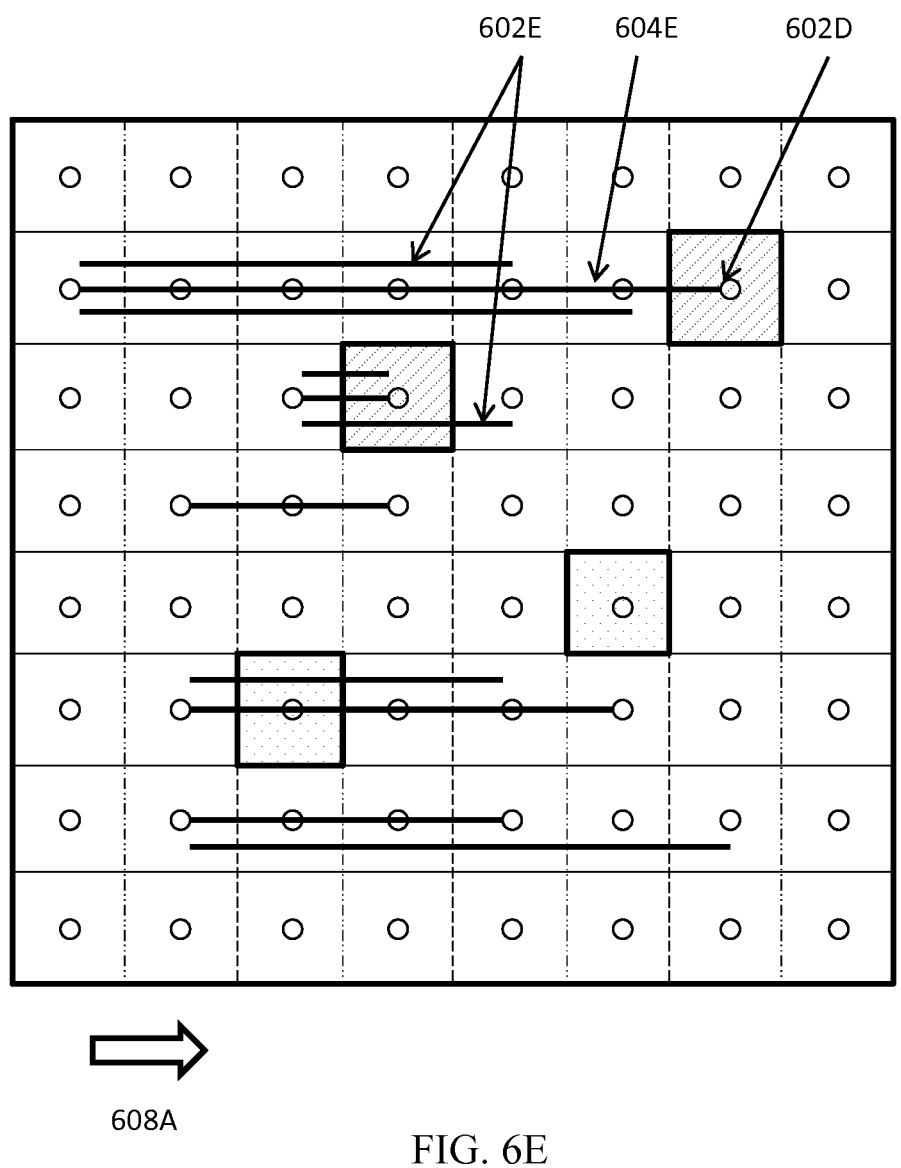
FIG. 6E illustrates an approach for performing routing in the routing space illustrated in FIG. 6C and including non-topological routes across both tracked or gridded region(s) and trackless or gridless region(s) in some embodiments.

FIG. 6E illustrates an approach for performing routing in the routing space illustrated in FIG. 6C and including non-topological routes across both tracked or gridded region(s) and trackless or gridless region(s) in some embodiments. More specifically, FIG. 6E illustrates the embodiments where the method or system may start the routing process to add routes or wires to the routing space by using the trackless routing approach. As described above, a trackless routing approach may use the width or the size of a trackless tessellated region or a routing cell associated therewith as the initial routing capacity and determine the remaining capacity by using the width(s) of the routes or wires and spacing values.

As routes and wires (e.g., 602E) are added to some of these trackless tessellated regions, the method or system may update the initial track pattern labels or the tentative track pattern labels for these tessellated regions according to the width(s) of the route(s) or wire(s) added to these tessellated regions. When a route or wire is to be implemented across the boundary between a trackless tessellated region and a tracked tessellated region, the method or system may switch from a trackless routing approach to a tracked routing approach. A tracked routing approach may use the types (e.g., associated widths) and numbers of the available tracks of the associated track patterns as the initial routing capacities of tracked tessellated regions and determine the remaining capacities by decreasing the numbers of corresponding tracks as new routes or wires associated with their respective widths are added to the design.

Moreover, even before the method or system routes the routes or wires 602E to a tracked tessellated region (e.g., 602D), the method or system may update the initial track pattern label or the tentative track pattern label for the tracked tessellated region. For example, the method or system may be implementing the routes or wires 602E in the trackless tessellated region 604E. Once the method or system determines that the routes or wires 602E may be crossing the boundary between 602D and 604E, the method or system may update the initial track pattern label or the tentative track pattern label for the tracked tessellated region 602D to accommodate the 2x-routes or 2x-wires 602E.

Figure 6F:
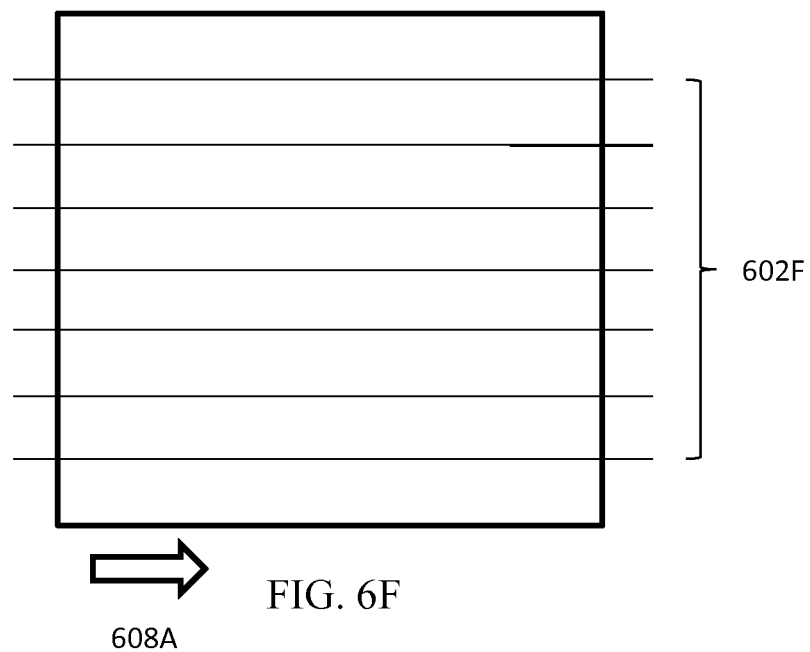
FIGS. 6F-G illustrate identifications of two different track patterns for a particular routing demand of a routing cell in some embodiments.
Figure 6G:
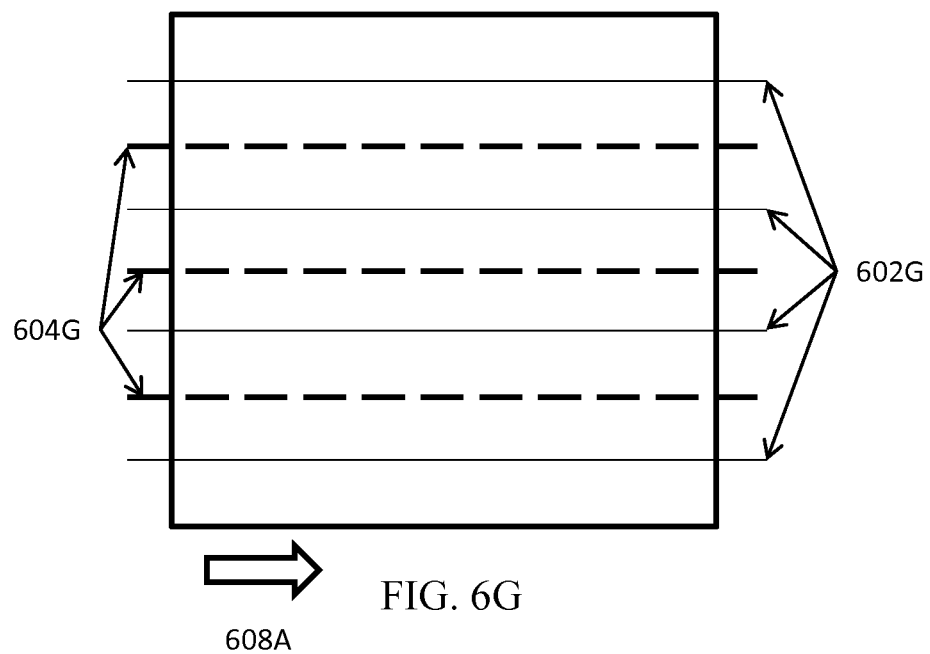

FIGS. 6F-G illustrate identifications of two different track patterns for a particular routing demand of a routing cell in some embodiments. More specifically, FIG. 6F-G illustrate that the method or system may identify a track pattern label from multiple track pattern candidate labels. For example, FIG. 6F illustrates that a tessellated region may be associated with the first label of the first track pattern including seven 1x-tracks 602F. FIG. 6G illustrates that the same tessellated region that may be associated with the second label of the second track pattern including four 1x-tracks 602G and three 2x-tracks 604G. As described above, the method or system may rank, order, or score these multiple track pattern candidate labels and identify a track pattern label from these multiple track pattern candidate labels based at least in part upon the rank, score, or order of the track pattern label in some embodiments.

Figure 7A:
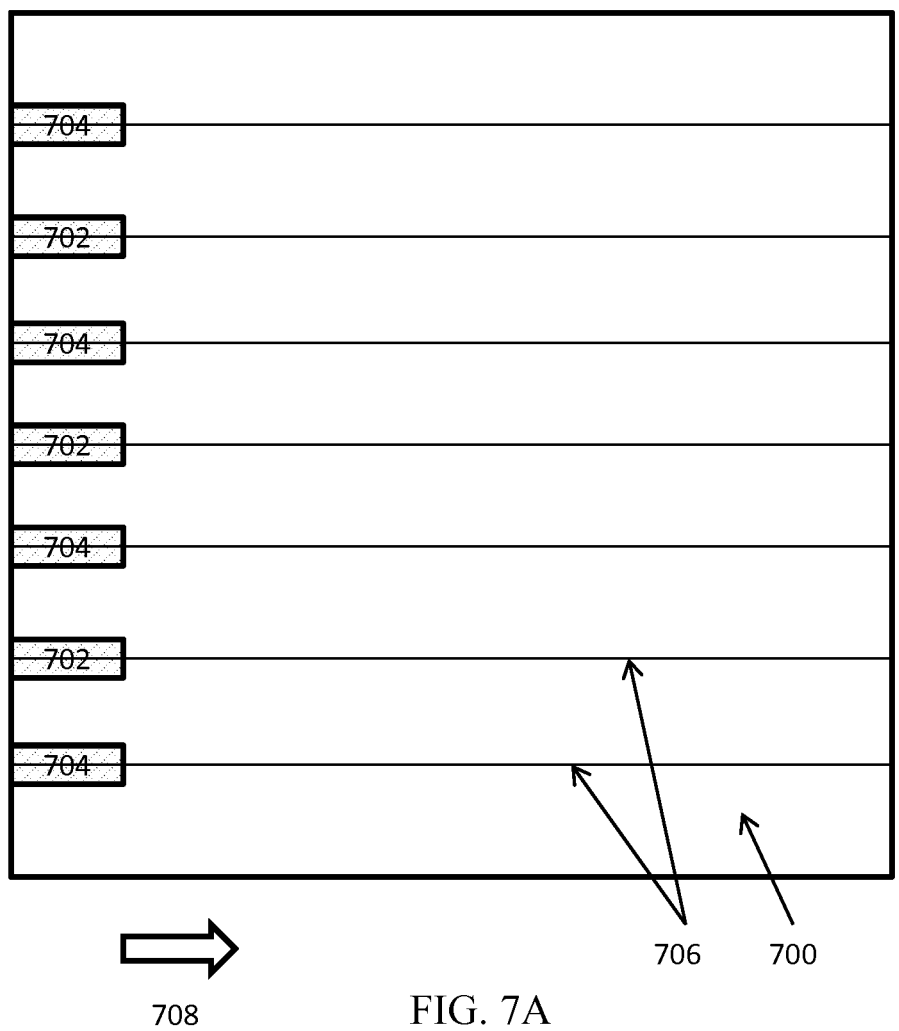
FIG. 7A illustrates a first set of tessellation lines with some circuit design elements in a routing space in some embodiments.

FIG. 7A illustrates a first set of tessellation lines with some circuit design elements in a routing space in some embodiments. More specifically, FIG. 7A illustrates the identification of some tessellation lines for a routing space 700. The method or system may identify the tessellation lines 706 that coincide with the centerlines of the power rails 702 and the centerlines of the ground rails 704 along the right-way routing direction 708 in a process to subdivide the routing space into multiple tessellated regions in some embodiments.

Figure 7B:
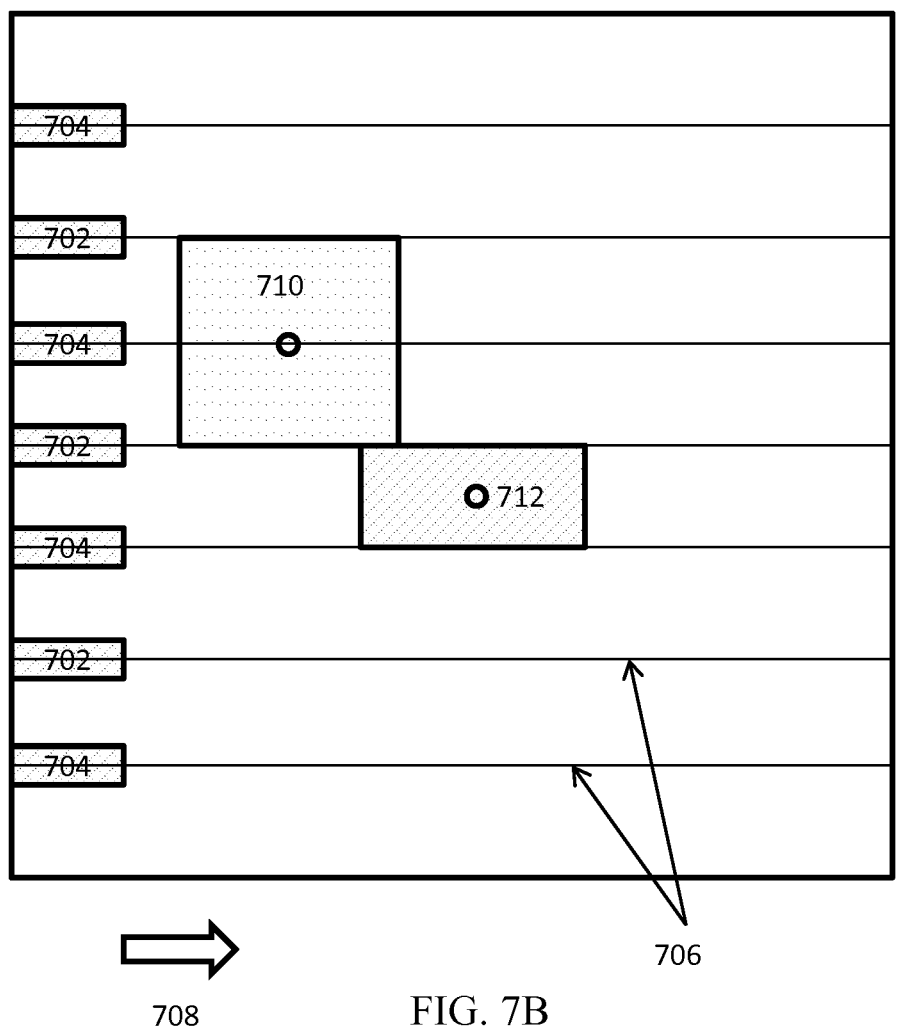
FIG. 7B illustrates placement of routing cells with respect to the first set of tessellation lines in the routing space illustrated in FIG. 7A in some embodiments.

FIG. 7B illustrates placement of routing cells with respect to the first set of tessellation lines in the routing space illustrated in FIG. 7A in some embodiments. More specifically, FIG. 7B illustrates that the method or system may identify two shapes 710 and 712 in the routing space. In some of the illustrated embodiments, either or both shapes 710 and 712 can be moved in the routing space. In some other embodiments, either or both shapes 710 and 712 are fixed and immovable in the routing space.

Figure 7C:
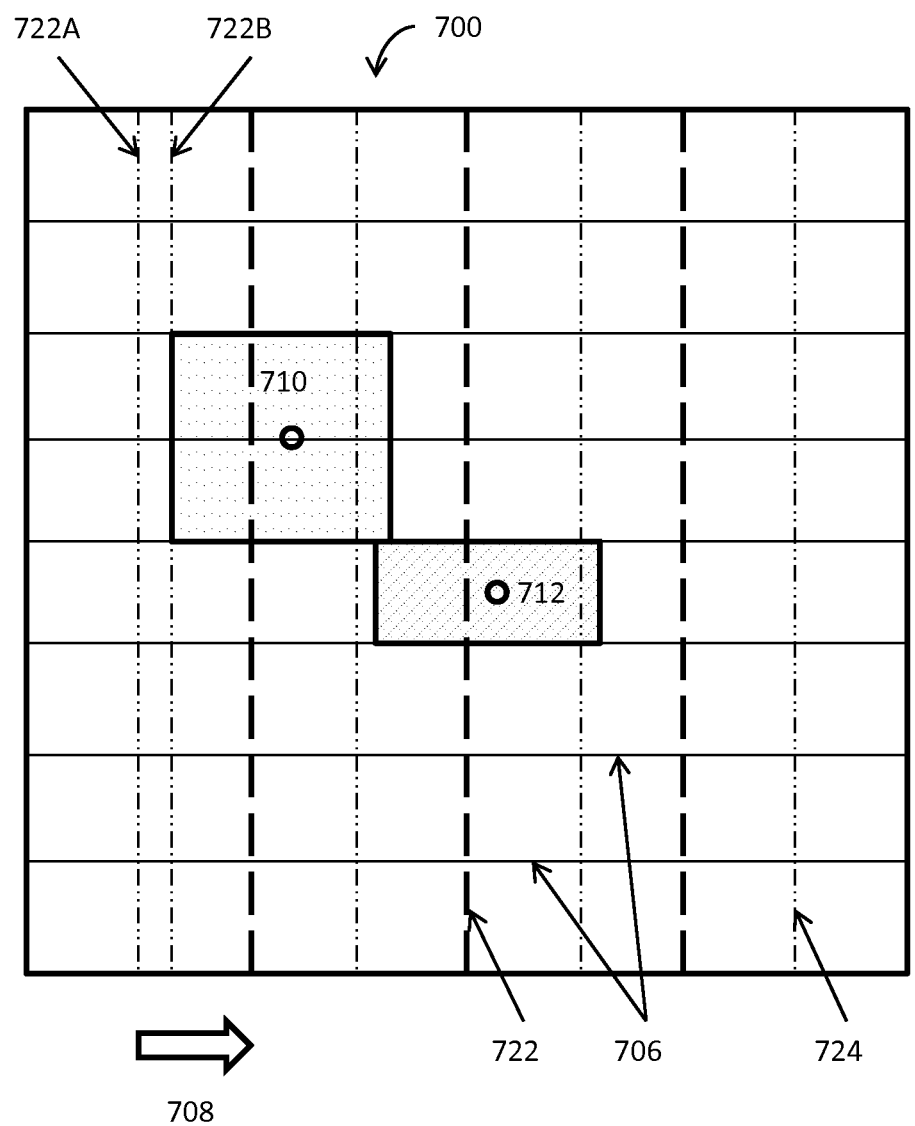
FIG. 7C illustrates a second set of tessellation lines in the routing space illustrated in FIGS. 7A-B in some embodiments.

FIG. 7C illustrates a second set of tessellation lines in the routing space illustrated in FIGS. 7A-B in some embodiments. More specifically, FIG. 7C illustrates the embodiments where the method or system identifies the tessellation lines 722 and 724 from either the current routing layer or from one or more immediately neighboring layers. For example, with the right-way routing direction 708, the first tessellation lines 706 may include the tessellation lines associated with the current layer, while the second tessellation lines 722 may include the tessellation lines associate with the immediately neighboring layer atop the current layer, and the third tessellation lines 724 may include the tessellation lines associate with the immediately neighboring layer below the current layer. Moreover, FIG. 7C may represent the embodiments where the shapes 710 and 712 are being added to the region 700 that already includes some tessellation lines (706, 722, and 724).

In these embodiments, the method or system may adjust the locations of the shapes 710 and 712 to align the boundaries of these two shapes with existing tessellation lines. These embodiments are further illustrated in FIG. 7D. In addition, the method or system may further adjust the tessellation lines (e.g., 706, 722, and 724) such that each shape (e.g., 710 or 712) may occupy no more than one tessellated region in some embodiments. In these embodiments, the method or system may remove some of the tessellation lines such that shape 710 occupies one tessellated region, and shape 712 occupies another tessellated region. In some other embodiments, a shape (e.g., 710 or 712) may include multiple sub-shapes, each of which is associated with its own track pattern. In these embodiments, the method or system may also adjust the tessellation lines such that the boundary segments of each of these sub-shapes or at least some of these sub-shapes are aligned with the corresponding tessellation lines, and each sub-shape occupies no more than one tessellated region.

In some other embodiments, FIG. 7C may represent the scenarios where the shapes 710 and 712 constitute fixed shapes and are thus immovable in the design. In these embodiments, the method or system may adjust the tessellation lines in this routing space 700. For example, the method or system may discard or remove the tessellation line 722A from the existing routing grids and identify and add the tessellation line 722B to the existing routing grids to subdivide the routing space 700 into appropriate tessellated regions. Similar to those embodiments where these two shapes 710 and 712 are movable, the method or system may adjust the tessellation lines (e.g., by removing tessellation line 722A from and adding tessellation line 722B into the routing grids) such that each shape, block, or cell (e.g., 710 or 712) may occupy no more than one tessellated region in some embodiments.

In these embodiments, the method or system may remove some of the tessellation lines (e.g., tessellation line 722A) such that shape 710 occupies one tessellated region, and shape 712 occupies another tessellated region. In some other embodiments, a shape (e.g., 710 or 712) may include multiple sub-shapes, each of which is associated with its own track pattern. In these embodiments, the method or system may also adjust the routing grids by adding or removing certain tessellation lines such that the boundary segments of each of these sub-shapes or at least some of these sub-shapes are aligned with the corresponding tessellation lines in the routing grids, and each sub-shape occupies no more than one tessellated region.

Figure 7D:
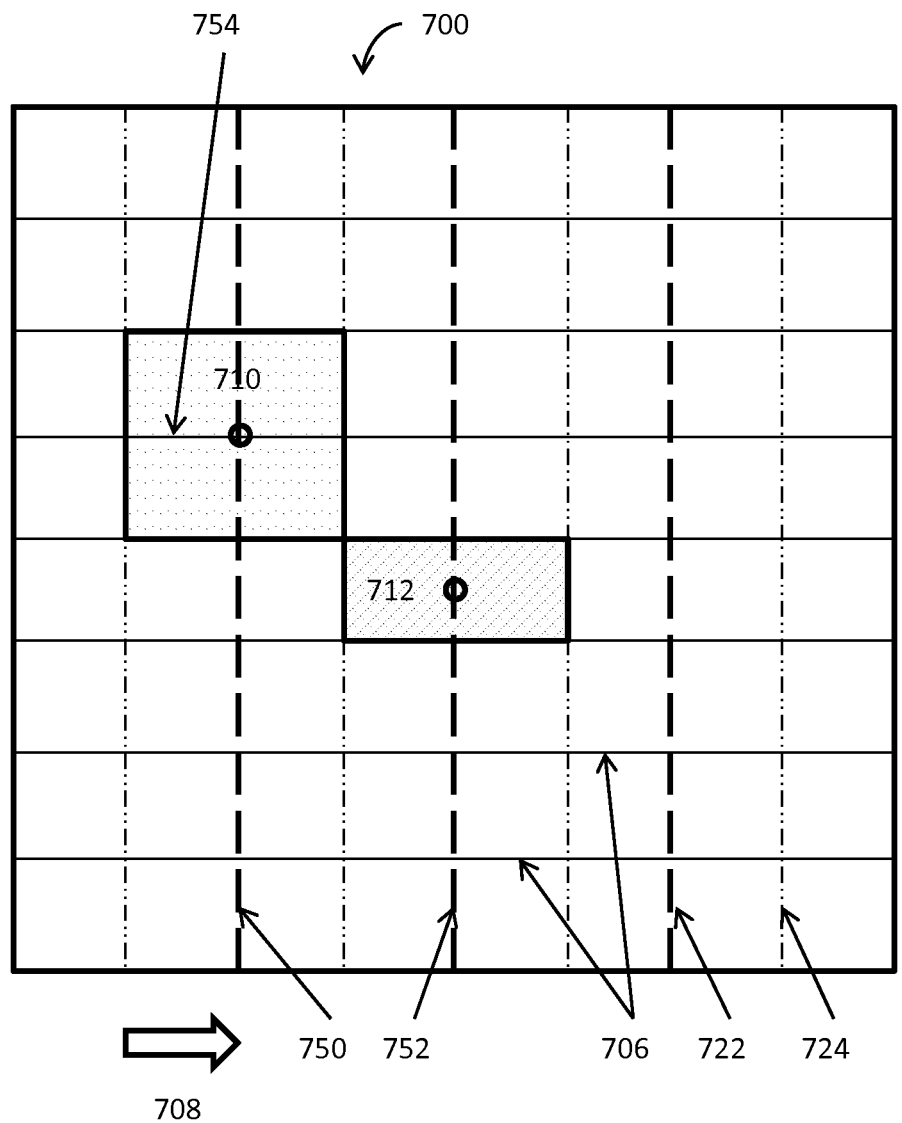
FIG. 7D illustrates placement of the two routing cells with respect to some tessellation lines in the second set of tessellation lines in the routing space illustrated in FIGS. 7A-C in some embodiments.

FIG. 7D illustrates placement of the two routing cells with respect to some tessellation lines in the second set of tessellation lines in the routing space illustrated in FIGS. 7A-C in some embodiments. More specifically, FIG. 7D illustrates the embodiments where the shapes 710 and 712 may be moved in the routing space. In these embodiments, the method or system may move the shapes 710 and 712 to align their respective boundary segments with the corresponding tessellation lines as shown in FIG. 7D. In some embodiments, the method or system may further adjust the subdivision of the routing space 700 by removing tessellation lines 750, 752, and 754 such that each shape or cell (e.g., 710 and 712) occupies no more than one tessellated region as shown in FIG. 7D.

Figure 7E:
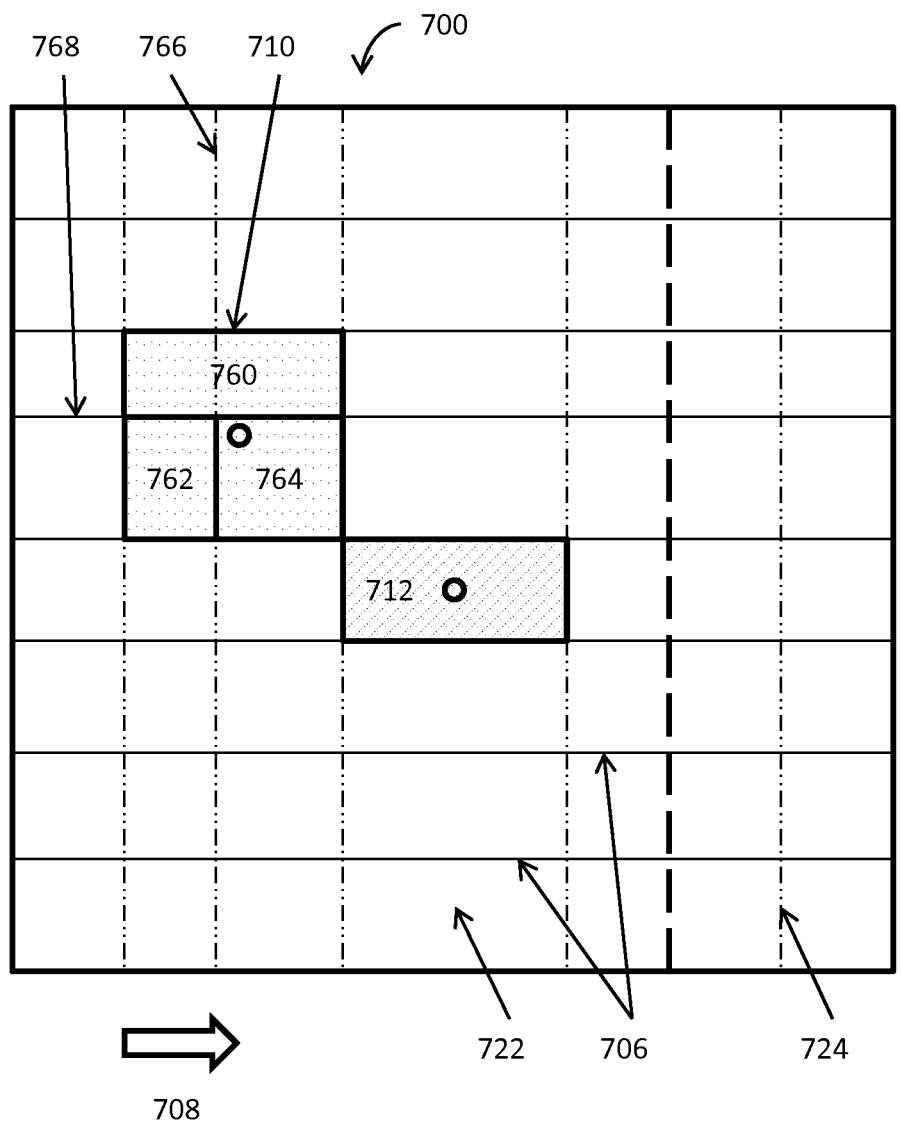
FIG. 7E illustrates adjusting the tessellation lines or the subdivision of the routing space illustrated in FIGS. 7A-D for a shape or cell in some embodiments.

FIG. 7E illustrates adjusting the tessellation lines or the subdivision of the routing space illustrated in FIGS. 7A-D for a shape or cell that includes multiple sub-shapes or sub-cells, each of which associated with the respective track pattern labels in some embodiments. In these embodiments, the shape or cell 710 includes three illustrative sub-shapes or sub-cells 760, 762, and 764. Moreover, the sub-shape or sub-cell 760 is associated with the first track pattern label corresponding to the first track pattern; the sub-shape or sub-cell 762 is associated with the second track pattern label corresponding to the second track pattern; and the sub-shape or sub-cell 764 is associated with the third track pattern label corresponding to the third track pattern.

For example, sub-shape 710 may comprise an intellectual property block (IP block) that includes predetermined routes as represented or controlled by these three track patterns. As another example, sub-cell 710 may comprise a routing cell (e.g., a global cell) that may be used to further implement some design components having predetermined routes as represented or controlled by these three track patterns. In these embodiments, the method or system may further adjust the tessellation lines or the subdivision of the routing space by identifying two additional tessellation lines 766 and 768 that further sub-divide the tessellated region corresponding to the cell or shape 710 into three tessellated sub-regions that respectively correspond to the three sub-cells or sub-shapes 760, 762, and 764.

In these embodiments, the cell or shape 710 is associated with all three track pattern labels. Nonetheless, each of the three track patterns corresponding to the three track pattern labels is used to guide the electronic design implementation tool(s) (e.g., a global router, a channel router, a conduit router, a detail router, etc.) in its corresponding tessellated sub-region. It shall be noted that a tessellated region may nevertheless be associated with more than one track pattern labels even when the tessellated region corresponds to a single cell or shape without a need or preference for further subdivision in some embodiments. The method or system may simultaneously use these multiple track patterns to guide the implementation of the design. For example, the method or system may update the respective remaining capacities of these multiple track patterns as a new route or wire is added to the tessellated region.

The method or system may also dynamically update the number of track patterns labels or their consistency costs or rankings associated with a single tessellated region by adding or removing one or more track pattern labels to the list of associated track pattern labels of the tessellated region. As another example, the method may remove or increase the consistency cost(s) of the label(s) of track pattern(s) that does (do) not support the implementation of 2×-routes or 2×-wires in the tessellated region when a 2×-route or wire is added to the tessellated region.

In addition or in the alternative, the method may add one or more labels of one or more corresponding track patterns to the list of associated track pattern labels for a tessellated region when a route or wire is forced off or removed from the tessellated region. For example, the method or system may determine to treat the associated track pattern labels as a hard requirement that must be satisfied and thus force any routes or shapes (e.g., wires) that cannot be implemented with the track patterns off the associated tessellated region and subsequently re-route or re-implement such routes or shapes in some embodiments.

In some other embodiments, the method or system may determine to treat the associated track pattern labels as a soft requirement that are preferred to be satisfied but need not be satisfied all the time. In these latter embodiments, the method or system may increase the consistency cost of a track pattern or a label therefor or lower the consistency ranking, order, or score of the track pattern or its label when a route or shape is added to the region that does not find an appropriate track for implementation. In yet some other embodiments, the method or system may replace the current track pattern with a different track pattern that provides appropriate tracks for implementation in the associated tessellated region.

System Architecture Overview

Figure 8:
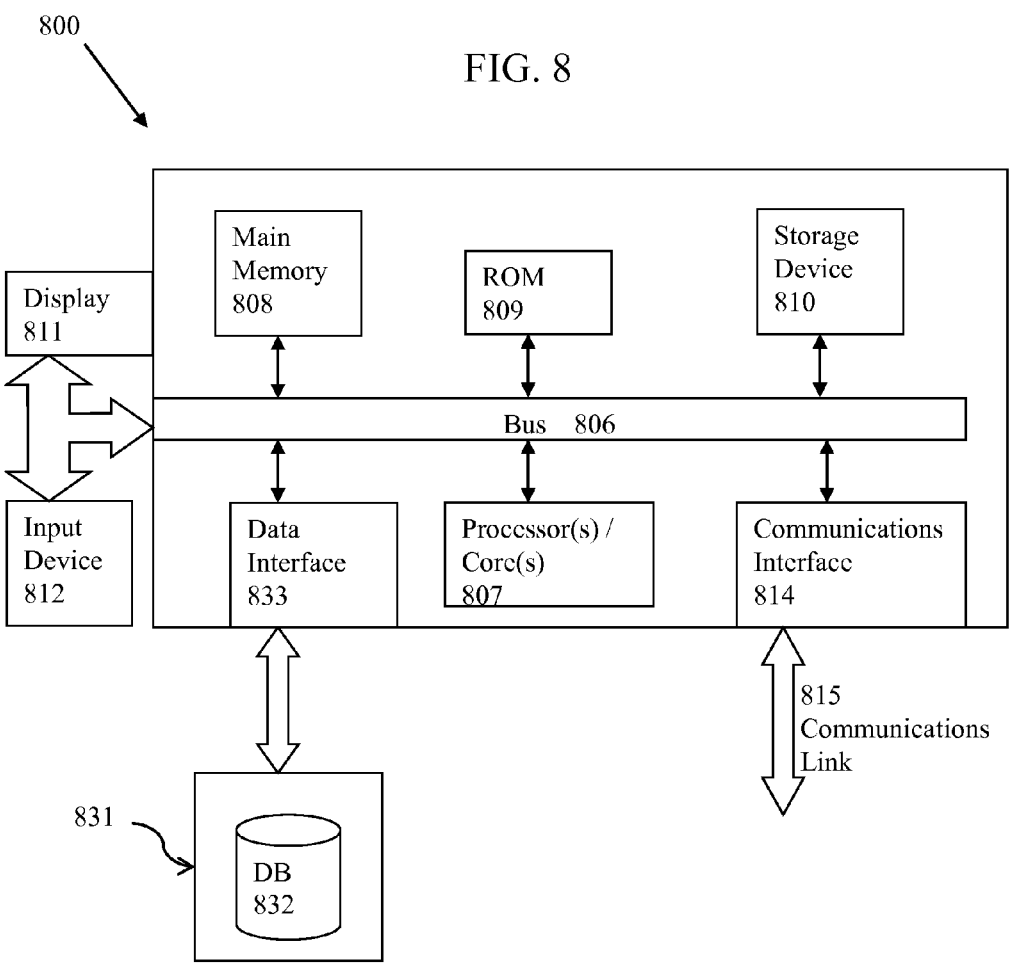
FIG. 8 illustrates a computerized system on which a method for tessellating and labeling routing space for routing electronic designs may be implemented in some embodiments.

FIG. 8 illustrates a computerized system on which a method for tessellating and labeling routing space for routing electronic designs may be implemented in some embodiments. Computer system 800 includes a bus 806 or other communication mechanism for communicating information, which interconnects subsystems and devices, such as processor 807, system memory 808 (e.g., RAM), static storage device 809 (e.g., ROM), disk drive 810 (e.g., magnetic or optical), communication interface 814 (e.g., modem or Ethernet card), display 811 (e.g., CRT or LCD), input device 812 (e.g., keyboard), and cursor control (not shown).

According to one embodiment, computer system 800 performs specific operations by one or more processor or processor cores 807 executing one or more sequences of one or more instructions contained in system memory 808. Such instructions may be read into system memory 808 from another computer readable/usable storage medium, such as static storage device 809 or disk drive 810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 807, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 807 for execution. Such a medium may take many forms, including but not limited to, non-volatile media and volatile media. Non-volatile media includes, for example, optical or magnetic disks, such as disk drive 810. Volatile media includes dynamic memory, such as system memory 808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 800. According to other embodiments of the invention, two or more computer systems 800 coupled by communication link 815 (e.g., LAN, PTSN, or wireless network) may perform the sequence of instructions required to practice the invention in coordination with one another.

Computer system 800 may transmit and receive messages, data, and instructions, including program, i.e., application code, through communication link 815 and communication interface 814. Received program code may be executed by processor 807 as it is received, and/or stored in disk drive 810, or other non-volatile storage for later execution. In an embodiment, the computer system 800 operates in conjunction with a data storage system 831, e.g., a data storage system 831 that contains a database 832 that is readily accessible by the computer system 800. The computer system 800 communicates with the data storage system 831 through a data interface 833. A data interface 833, which is coupled to the bus 806, transmits and receives electrical, electromagnetic or optical signals that include data streams representing various types of signal information, e.g., instructions, messages and data. In embodiments of the invention, the functions of the data interface 833 may be performed by the communication interface 814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for tessellating and labeling routing space for routing electronic designs, comprising:
   using a computing system having at least one processor or at least one processor core to perform a process, the process comprising:
   creating, at a tessellation mechanism including or functioning in tandem with the at least one processor, routing grids that define multiple tessellated regions for at least a portion of a layer of an electronic design;
   determining, at a region labeling mechanism coupled with the tessellation mechanism, a tentative track pattern label by identifying the tentative track pattern label from multiple track pattern labels for at least one tessellated region of the multiple tessellated regions based in part or in whole upon one or more criteria, wherein the tentative track pattern label indicates which track pattern comprising an arrangement of tracks in a permissible order is to be used for physical implementation of the at least one tessellated region; and
   performing, at one or more routing mechanisms including or function in tandem with the at least one processor and coupled with the region labeling mechanism, routing for the portion of the layer by referencing the tentative track pattern label for the at least one tessellated region to interconnect circuit component designs in the layer of the electronic design.

2. The computer implemented method of claim 1, wherein the act of creating the routing grids comprises:
   identifying a first shape or route in the at least the portion of the layer, wherein the first shape or route comprises a fixed shape, a detail shape, a global route, a channel route, a conduit route, or a detail route;
   identifying at least two tessellation lines from a set of tessellation lines for the tessellation lines based at least in part upon one or more first boundary segments of the first shape; and
   aligning one or more second boundary segments of a second shape or a cell with corresponding one or more tessellation lines defining the routing grids.

3. The computer implemented method of claim 1, wherein the act of creating the routing grids comprises:
   identifying first tessellation lines from a first set of tessellation lines for the at least the portion of the layer;
   identifying a first direction for the layer; and
   subdividing the at least the portion of the layer by using at least the tessellation lines for creating the routing grids in the first direction.

4. The computer implemented method of claim 3, wherein the act of creating the routing grids further comprises:
   identifying second tessellation lines from a second set of tessellation lines for one or more neighboring layers of the layer;
   identifying a second direction for the layer; and
   subdividing the at least the portion of the layer by using at least the second tessellation lines for creating the routing grids in the second direction.

5. The computer implemented method of claim 1, the process further comprising:
   identifying a first cell for routing in the at least the portion of the layer;
   identifying one or more boundary segments a first cell for routing in the at least the portion of the layer; and
   aligning the one or more boundary segments of the first cell with one or more corresponding grid lines of the routing grids.

6. The computer implemented method of claim 1, the process further comprising at least one of:
   determining the tentative track pattern label from an initial track pattern label for the at least the portion of the layer; and
   adjusting the routing grids by adding or removing one or more tessellation lines defining the routing grids.

7. The computer implemented method of claim 1, the process further comprising:
   identifying multiple candidate track patterns and multiple labels corresponding to the multiple candidate track patterns;
   determining rankings or consistency costs of the multiple candidate track patterns; and
   identifying the tentative track pattern label from the multiple labels based at least in part upon the rankings or the consistency costs of the multiple candidate track patterns.

8. The computer implemented method of claim 1, the act of performing routing for the portion of the layer comprising:
   determining whether or not a tessellated region is tracked or trackless;
   determining whether or not the tessellated region is associated with the tentative track pattern label;
   identifying capacity of a cell associated with the tessellated region; and
   identifying a demand on a cell associated with the tessellated region.

9. The computer implemented method of claim 8, the act of performing routing for the portion of the layer further comprising:
   identifying a width of a boundary segment of the cell, wherein the tessellated region is determined to be trackless;
   assigning the width of the boundary segment to the capacity of the cell; and
   identifying a width for a route to be implemented in the cell and a spacing value for the route.

10. The computer implemented method of claim 9, the act of performing routing for the portion of the layer further comprising:

performing the routing for the portion of the layer by implementing the route in the cell; and
decreasing the capacity of the cell based at least in part upon the width for the route and the spacing value for the route.

11. The computer implemented method of claim 8, the act of performing routing for the portion of the layer further comprising:
    identifying a label of a track pattern associated with the tessellated region, wherein the tessellated region is determined to be tracked;
    identifying a width for a route to be implemented in the cell; and
    identifying a first set of tracks associated with the width in the track pattern and a total number of tracks in the first set.

12. The computer implemented method of claim 11, the act of performing routing for the portion of the layer further comprising:
    performing the routing for the portion of the layer by implementing the route in the cell; and
    decreasing the capacity of the cell based at least in part upon the total number of tracks in the track pattern and the route.

13. An article of manufacture comprising a non-transitory computer accessible storage medium having stored thereupon a sequence of instructions which, when executed by at least one processor or at least one processor core executing one or more threads, causes the at least one processor or the at least one processor core to perform a method for tessellating and labeling routing space for routing electronic designs, the method comprising:
    creating, at a tessellation mechanism including or functioning in tandem with the at least one processor, routing grids that define multiple tessellated regions for at least a portion of a layer of an electronic design;
    determining, at a region labeling mechanism coupled with the tessellation mechanism, a tentative track pattern label by identifying the tentative track pattern label from multiple track pattern labels for at least one tessellated region of the multiple tessellated regions based in part or in whole upon one or more criteria, wherein the tentative track pattern label indicates which track pattern comprising an arrangement of tracks in a permissible order is to be used for physical implementation of the at least one tessellated region; and
    performing, at one or more routing mechanisms including or function in tandem with the at least one processor and coupled with the region labeling mechanism, routing for the portion of the layer by referencing the tentative track pattern label for the at least one tessellated region to interconnect circuit component designs in the layer of the electronic design.

14. The article of manufacture of claim 13, the process further comprising:
    identifying a first cell for routing in the at least the portion of the layer;
    identifying one or more boundary segments a first cell for routing in the at least the portion of the layer; and
    aligning the one or more boundary segments of the first cell with one or more corresponding grid lines of the routing grids.

15. The article of manufacture of claim 13, the process further comprising:
    identifying multiple candidate track patterns and multiple labels corresponding to the multiple candidate track patterns;
    determining rankings or consistency costs of the multiple candidate track patterns; and
    identifying the tentative track pattern label from the multiple labels based at least in part upon the rankings or the consistency costs of the multiple candidate track patterns.

16. The article of manufacture of claim 13, the act of performing routing for the portion of the layer comprising:
    determining whether or not a tessellated region is tracked or trackless;
    determining whether or not the tessellated region is associated with the tentative track pattern label;
    identifying capacity of a cell associated with the tessellated region; and
    identifying a demand on a cell associated with the tessellated region.

17. A system for tessellating and labeling routing space for routing electronic designs, comprising:
    non-transitory computer accessible storage medium having stored thereupon program code that comprises a sequence of instructions; and
    at least one processor or at least one processor core of a computing system executing the sequence of instructions at least to:
    create, at a tessellation mechanism including or functioning in tandem with the at least one processor, routing grids that define multiple tessellated regions for at least a portion of a layer of an electronic design;
    determine, at a region labeling mechanism coupled with the tessellation mechanism, a tentative track pattern label by identifying the tentative track pattern label from multiple track pattern labels for at least one tessellated region of the multiple tessellated regions based in part or in whole upon one or more criteria, wherein the tentative track pattern label indicates which track pattern comprising an arrangement of tracks in a permissible order is to be used for physical implementation of the at least one tessellated region; and
    perform, at one or more routing mechanisms including or function in tandem with the at least one processor and coupled with the region labeling mechanism, routing for the portion of the layer by referencing the tentative track pattern label for the at least one tessellated region to interconnect circuit component designs in the layer of the electronic design.

18. The system of claim 17, wherein the at least one processor or the at least one processor core further executes the sequence of instructions to:
    identify a first cell for routing in the at least the portion of the layer;
    identify one or more boundary segments a first cell for routing in the at least the portion of the layer; and
    align the one or more boundary segments of the first cell with one or more corresponding grid lines of the routing grids.

19. The system of claim 17, wherein the at least one processor or the at least one processor core further executes the sequence of instructions to:
    identify multiple candidate track patterns and multiple labels corresponding to the multiple candidate track patterns;
    determine rankings or consistency costs of the multiple candidate track patterns; and
    identify the tentative track pattern label from the multiple labels based at least in part upon the rankings or the consistency costs of the multiple candidate track patterns.

20. The system of claim 17, wherein the at least one processor or the at least one processor core that executes the sequence of instructions to perform routing for the portion of the layer further executes the sequence of instructions to:
- determine whether or not a tessellated region is tracked or trackless;
- determine whether or not the tessellated region is associated with the tentative track pattern label;
- identify capacity of a cell associated with the tessellated region; and
- identify a demand on a cell associated with the tessellated region.

\* \* \* \* \*